United States Patent
Moriya et al.

(10) Patent No.: US 7,399,989 B2
(45) Date of Patent: Jul. 15, 2008

(54) ELECTRODE, METHOD FOR FORMING AN ELECTRODE, THIN-FILM TRANSISTOR, ELECTRONIC CIRCUIT, ORGANIC ELECTROLUMINESCENT ELEMENT, DISPLAY, AND ELECTRONIC EQUIPMENT

(75) Inventors: Soichi Moriya, Fujimi-cho (JP); Takeo Kawase, Fujimi-cho (JP); Mitsuaki Harada, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 285 days.

(21) Appl. No.: 10/903,386

(22) Filed: Aug. 2, 2004

(65) Prior Publication Data

US 2005/0057136 A1 Mar. 17, 2005

(30) Foreign Application Priority Data

| Aug. 19, 2003 | (JP) | ............................. 2003-207936 |
| Dec. 19, 2003 | (JP) | ............................. 2003-423745 |
| May 31, 2004 | (JP) | ............................. 2004-162538 |

(51) Int. Cl.
   *H01L 35/24* (2006.01)
(52) U.S. Cl. ...................................... 257/40
(58) Field of Classification Search ................. 257/40
   See application file for complete search history.

(56) References Cited

U.S. PATENT DOCUMENTS 5,358,987 A * 10/1994 Kanai et al. .................. 524/254
6,266,041 B1 * 7/2001 Cairns et al. ................. 345/100
6,808,972 B2 * 10/2004 Sirringhaus et al. ......... 438/200

(Continued)

FOREIGN PATENT DOCUMENTS

JP   A-2001-155867   6/2001

(Continued)

OTHER PUBLICATIONS

Rogers et al. "Paper-Like Electronic Displays: Large-Area Rubber-Stamped Plastic Sheets of Electronics and Microencapsulated Electrophoretic Inks," PNAS, Applied Physical Sciences, vol. 24, No. 9, Apr. 24, 2001, pp. 4835-4840.

(Continued)

*Primary Examiner*—Thien F Tran
(74) *Attorney, Agent, or Firm*—Oliff & Berridge, PLC

(57) ABSTRACT

An electrode is provided that is economically produced and capable of efficiently injecting holes. Also provided are a method to form an electrode that is capable of easily manufacturing such an electrode, a highly reliable thin-film transistor, an electronic circuit using this thin-film transistor, an organic electroluminescent element, a display, and electronic equipment. A thin-film transistor is a top-gate thin-film transistor. The thin-film transistor includes a source electrode and a drain electrode that are placed separately from each other. The thin-film transistor also includes an organic semiconductor layer that is laid out between the source electrode and the drain electrode, and a gate insulating layer that is provided between the organic semiconductor layer and a gate electrode. This structure is mounted on a substrate. Each of the source electrode and the drain electrode is composed of two layers, that is, an underlying electrode layer and a surface electrode layer. The surface electrode layer includes an oxide containing at least one of Cu, Ni, Co, Ag.

7 Claims, 11 Drawing Sheets

U.S. PATENT DOCUMENTS

| | | |
|---|---|---|
| 7,002,176 B2 * | 2/2006 | Iechi et al. .................... 257/40 |
| 2002/0021088 A1 | 2/2002 | Howard et al. |
| 2004/0012017 A1 * | 1/2004 | Nagayama .................. 257/40 |

FOREIGN PATENT DOCUMENTS

| JP | A 2004-62040 | 2/2004 |
|---|---|---|
| KR | A-2001-0051829 | 6/2001 |

OTHER PUBLICATIONS

Kawase et al. "All-Polymer Thin Film Transistors Fabricated by High-Resolution Ink-Jet Printing," 2000 IEEE.

* cited by examiner

ELECTRODE, METHOD FOR FORMING AN ELECTRODE, THIN-FILM TRANSISTOR, ELECTRONIC CIRCUIT, ORGANIC ELECTROLUMINESCENT ELEMENT, DISPLAY, AND ELECTRONIC EQUIPMENT

BACKGROUND OF THE INVENTION

1. Field of Invention

The present invention relates to an electrode, a method to form an electrode, a thin-film transistor, an electronic circuit, an organic electroluminescent element, a display, and electronic equipment.

2. Description of Related Art

Related art organic thin-film field-effect transistors using organic semiconductor materials may be potential substitutions for thin-film field-effect transistors using inorganic materials represented by silicon. Typical related art organic thin-film transistors have a structure using gold for their source and drain electrodes, as described in Rogers et al. 24 Apr. 2001. *Proceedings of the National Academy of Sciences.* Vol. 98. No. 948354840, for example.

Specifically, a thin-film transistor described in Rogers et al. 24 Apr. 2001. *Proceedings of the National Academy of Sciences.* Vol. 98. No. 948354840 has a structure in which a gate electrode is formed by etching indium tin oxide (ITO) by photolithography on a polyethylene terephthalate substrate and a gate insulating layer is made of organic siloxane and silicon nitride. Then, a gold thin film is formed by vapor deposition and patterned by microcontact printing, so as to form source and drain electrodes. Subsequently, an organic semiconductor layer (p-type organic semiconductor layer) is formed by vapor deposition, which completes the transistor.

The organic transistor described in Rogers et al. 24 Apr. 2001. *Proceedings of the National Academy of Sciences.* Vol. 98. No. 948354840, however, leaves room for improvement in terms of cost, since the source and drain electrodes are formed by depositing and etching a costly gold thin film. If an alternative economical metal, such as aluminum, is used to form the electrodes, there arises a problem of lowering transistor properties as a result of a large barrier at the interface of the source electrode and the organic semiconductor layer, which results in low efficiency in injecting carriers (holes).

SUMMARY OF THE INVENTION

An exemplary aspect of the present invention provides an electrode that is economically produced and capable of efficiently injecting holes, a method to form an electrode that is capable of easily manufacturing such an electrode, a highly reliable thin-film transistor, an electronic circuit using this thin-film transistor, a highly reliable organic electroluminescent element, a display, and electronic equipment.

An electrode of one exemplary aspect of the present invention includes an oxide having at least one of Cu, Ni, Co on a surface of the electrode, at least on a side of an organic layer. The organic layer is mainly made of an organic material and has a function of transporting a hole. The electrode injects a hole into the organic layer. It is also possible to include an oxide not only in the surface but also all over the electrode. This enables the electrode to be economically manufactured and to efficiently inject a hole.

In an electrode of another exemplary aspect of the present invention, a content of the oxide may be 50 wt % or more in a portion where the oxide is included. This enhances efficiency in injecting a hole. In an electrode of another aspect of the present invention, the oxide may include at least one of Sr, Al, Ga, Li, Na, K, Rb, Cs in addition to Cu, Ni, Co. This increases electric conductivity and efficiency in injecting a hole.

An electrode of another exemplary aspect of the present invention includes a plurality of layers, and an oxide including at least one of Cu, Ni, Co in a layer among the plurality of layers that is closest to an organic layer. The organic layer is mainly made of an organic material and has a function of transporting a hole. The electrode injects a hole into the organic layer. This enables the electrode to be economically manufactured and efficiently inject a hole. Here, the plurality of layers may be made up of any number of layers that is two or more. It may also be three or more layers. It is also possible to include an oxide in all the plurality of layers.

In an electrode of another exemplary aspect of the present invention, a content of the oxide may be 50 wt % or more in a layer that is closest to the organic layer. This enhances efficiency in injecting a hole. In an electrode of another exemplary aspect of the present invention, the oxide may include at least one of Sr, Al, Ga, Li, Na, K, Rb, Cs in addition to Cu, Ni, Co. This increases electric conductivity and efficiency in injecting a hole.

In an electrode of another exemplary aspect of the present invention, among the plurality of layers of the electrode, a layer that is closest to the organic layer may have a larger work function than any other layers of the electrode have. This makes it possible to inject a hole into the organic layer more efficiently. An electrode of another exemplary aspect of the present invention may be made up of two layers, and a layer of the two layers that is on an opposite side to the organic layer is mainly made of Cu, Ni, Co, or an alloy including Cu, Ni, Co. This makes it possible to economically form the electrode and increase adhesiveness between the two layers.

An electrode of another exemplary aspect of the present invention includes at least one of a metal sulfide and a metal chloride on a surface of the electrode, at least on a side of an organic layer. The organic layer is mainly made of an organic material and has a function of transporting a hole. The electrode injects a hole into the organic layer. This enables the electrode to be economically manufactured and efficiently inject a hole.

An electrode of another exemplary aspect of the present invention includes a plurality of layers, and at least one of a metal sulfide and a metal chloride in a layer among the plurality of layers that is closest to an organic layer. The organic layer is mainly made of an organic material and has a function of transporting a hole. The electrode injects a hole into the organic layer. This enables the electrode to be economically manufactured and efficiently inject a hole.

In an electrode of another exemplary aspect of the present invention, the metal sulfide may be mainly a metal sulfide including Cu. This further enhances efficiency in injecting a hole. In an electrode of another exemplary aspect of the present invention, the metal chloride may be mainly a metal chloride including Ag. This further enhances efficiency in injecting a hole.

A method to form an electrode of one exemplary aspect of the present invention includes forming a metal film that is mainly made of Cu, Ni, Co, or an alloy including Cu, Ni, Co; and oxidizing a surface of the metal film by providing an oxidization treatment to the metal film. This makes it possible to easily and reliably form an electrode that is capable of efficiently injecting a hole into an organic layer.

In a method to form an electrode of another exemplary aspect of the present invention, the oxidization treatment may be plasma treatment performed in an atmosphere including oxygen. This makes it possible to provide an oxide evenly around the surface of the electrode. In a method to form an electrode of another exemplary aspect of the present invention, the plasma treatment may be performed at an atmospheric pressure. This makes it possible to form the electrode easier and economically. In a method for forming an electrode of another exemplary aspect of the present invention, the metal film may be formed by plating. This makes it possible to form the electrode more accurately. In a method to form an electrode of another exemplary aspect of the present invention, the plating may be electroless plating. This makes it possible to easily and reliably form the electrode of a desired composition.

A thin-film transistor of one exemplary aspect of the present invention includes a source electrode including the electrode of an exemplary aspect of the present invention, and an organic semiconductor layer as the organic layer that is mainly made of a p-type organic semiconductor material. This makes it possible to provide a highly reliable thin-film transistor. A thin-film transistor of another exemplary aspect of the present invention includes a source electrode formed by a method to form an electrode of an exemplary aspect of the present invention, and an organic semiconductor layer as the organic layer that is mainly made of a p-type organic semiconductor material. This makes it possible to provide a highly reliable thin-film transistor.

A thin-film transistor of one exemplary aspect of the present invention includes an organic semiconductor layer that is mainly made of a p-type organic semiconductor material, and a source electrode that injects a hole into the organic semiconductor layer. The source electrode includes an oxide including Ag at least on a side of the organic semiconductor layer. This makes it possible to provide a highly reliable thin-film transistor.

A thin-film transistor of another exemplary aspect of the present invention includes an organic semiconductor layer that is mainly made of a p-type organic semiconductor material, and a source electrode that injects a hole into the organic semiconductor layer. The source electrode includes a plurality of layers, and an oxide including Ag in a layer among the plurality of layers that is closest to the organic semiconductor layer. This makes it possible to provide a highly reliable thin-film transistor.

In a thin-film transistor of another exemplary aspect of the present invention, the organic semiconductor material may be mainly made of a polymer organic semiconductor material. This enhances the property (switching property) of the thin-film transistor. In an thin-film transistor of another exemplary aspect of the present invention, the source electrode may directly contact with the organic semiconductor layer. This increases efficiency in injecting a hole into the organic semiconductor layer.

An electronic circuit of one exemplary aspect of the present invention includes a thin-film transistor of an exemplary aspect of the present invention. This makes it possible to provide a highly reliable electronic circuit. An organic electroluminescent element of one exemplary aspect of the present invention includes an anode including an electrode of an exemplary aspect of the present invention and an organic electroluminescent layer including the organic layer. This makes it possible to provide a highly reliable organic electroluminescent element. A display of one exemplary aspect of the present invention includes an electronic circuit of an exemplary aspect of the present invention. This makes it possible to provide a highly reliable display.

A display of another exemplary aspect of the present invention includes an organic electroluminescent element of an exemplary aspect of the present invention. This makes it possible to provide a highly reliable display. Electronic equipment of one exemplary aspect of the present invention includes the display of an exemplary aspect of the present invention. This makes it possible to provide highly reliable electronic equipment.

The present invention provides an electrode that is economically manufactured and efficiently injects a hole. The present invention also provides a highly reliable thin-film transistor, electronic circuit, organic electroluminescent element, display, and electronic equipment.

DETAILED DESCRIPTION OF EXEMPLARY EMBODIMENTS

An electrode, a method to form an electrode, a thin-film transistor, an electronic circuit, an organic electroluminescent (EL) element, a display, and electronic equipment of exemplary embodiments of the present invention will be described in greater detail with reference to the accompanying drawings.

Thin-Film Transistor

First, a thin-film transistor having an electrode of an exemplary aspect of the present invention will be described.

First Exemplary Embodiment

A thin-film transistor according to a first exemplary embodiment of the present invention will now be described.

Figure 1:
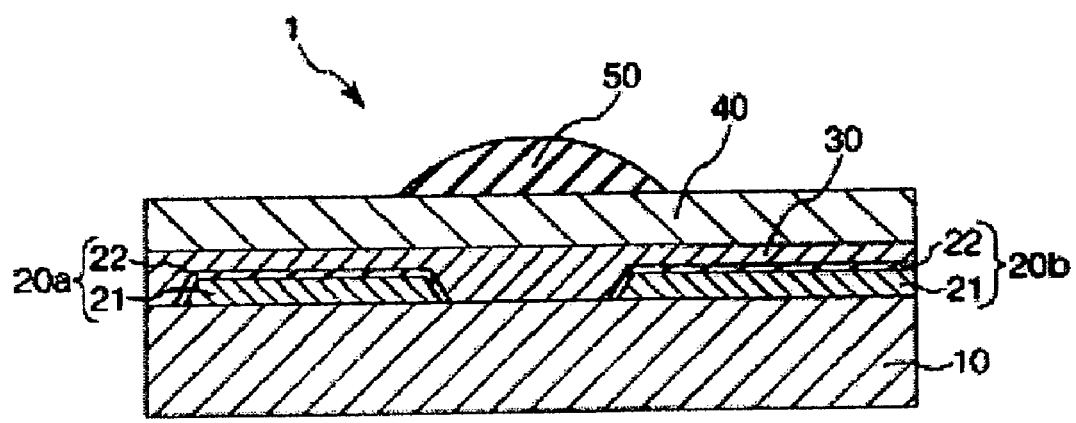
FIG. 1 is a schematic showing a thin-film transistor according to a first exemplary embodiment of the present invention.

FIG. 1 is a schematic showing a thin-film transistor according to the first exemplary embodiment of the present invention. FIGS. 2(a)-2(d) and 3(e) and 3(f) are schematics illustrating a method to manufacture the thin-film transistor shown in FIG. 1.

A thin-film transistor 1 shown in FIG. 1 is a top-gate thin-film transistor. The thin-film transistor 1 includes a source electrode 20a and a drain electrode 20b that are placed separately from each other. The thin-film transistor 1 also includes an organic semiconductor layer 30 that is laid out between the source electrode 20a and the drain electrode 20b, and a gate insulating layer 40 that is provided between the organic semiconductor layer 30 and a gate electrode 50. This structure is mounted on a substrate 10.

Each element will now be described in greater detail. The substrate 10 supports each layer (each element) making up the thin-film transistor 1. Examples of the material of the substrate 10 include glass substrates; plastic substrates (resin substrates) containing polyethylene terephthalate (PET), polyethylene naphthalate (PEN), polyethersulphone (PES), aromatic polyester (liquid crystal polymer), polyimide (PI), or the like; quartz substrates; silicon substrates, metal substrates; and gallium arsenide substrates.

In order to provide flexibility to the thin-film transistor 1, the substrate 10 may be a plastic substrate or a thin metal substrate whose thickness is comparatively small. Provided on the substrate 10 is the source electrode 20a and the drain electrode 20b. Of these electrodes, the source electrode 20a corresponds to the electrode of an exemplary aspect of the present invention to inject holes into the organic semiconductor layer 30, which will be described in greater detail later.

Each of the source electrode 20a and the drain electrode 20b is composed of multiple layers (two layers, that is, an underlying electrode layer 21 and a surface electrode layer 22 in the present exemplary embodiment). The underlying electrode layer 21 (base) may be made of various types of metal materials or conductive oxide materials, and is preferably made of mainly Cu, Ni, Co, an alloy containing the above-mentioned, Ag, or an alloy containing Ag. Since these metal materials are comparatively economical, using them can reduce the manufacturing cost of the thin-film transistor 1.

As will be described later, if the surface electrode layer 22 is made of an oxide containing at least one of Cu, Ni, and Co, or containing Ag, using the underlying electrode layer 21 made of mainly Cu, Ni, Co, an alloy containing the above-mentioned, Ag, or an alloy containing Ag, can enhance adhesion between the underlying electrode layer 21 and the surface electrode layer 22. If the surface electrode layer 22 is made of a metal sulfide or metal chloride, using the underlying electrode layer 21 made of mainly the metal included in the metal sulfide or metal chloride or an alloy containing the metal, can also enhance adhesion between the underlying electrode layer 21 and the surface electrode layer 22.

The surface electrode layer 22, which is the closest layer to the organic semiconductor layer 30, is provided so as to cover the underlying electrode layer 21. The surface electrode layer 22 is made of at least one of the following: an oxide containing at least one of Cu, Ni, and Co, or an oxide containing Ag; and a metal sulfide or metal chloride. Examples of the oxide may be one of the following or a combination of two or more of them: Cu oxides represented by $Cu(II)_{1-x}O$ ($0 \leq x<1$) or $Cu(I)_{2(1-x)}O$ ($0 \leq x<1$), Ni oxides represented by $Ni_{1-x}O$ ($0 \leq x<1$), Co oxides represented by $Co_{1-x}O$ ($0 \leq x<1$), Ag oxides represented by $Ag(II)_{1-x}O$ ($0 \leq x<1$) or $Ag(I)_{2(1-x)}O$ ($0 \leq x<1$), and complex oxides containing at least one element from Sr, Al, Ga, Li, Na, K, Rb, and Cs to be added to the above-mentioned oxides in addition to the already contained Cu, Ni, and Co.

In general, metal materials with high work functions are expensive, and conversely, economical metal materials tend to have low work functions. Moreover, oxides (metal compounds) usually have larger work functions than individual metals contained in the oxides have. Accordingly, using the surface electrode layer 22 made of the oxides can make it easy to set a larger work function for the surface electrode layer 22, which is an oxide-containing layer, than that of the underlying electrode layer 21, while using an economical material for the underlying electrode layer 21. This makes it possible to provide the source electrode 20a capable of efficiently injecting holes into the organic semiconductor layer 30 without increasing cost.

Oxides have low activity to organic materials, that is, the action of altering or deteriorating organic materials, compared to individual metals contained in the oxides. Therefore, it is also possible to prevent an organic layer (the organic semiconductor layer 30 according to the present exemplary embodiment), coming in contact with the source electrode 20a and the drain electrode 20b, from being altered and deteriorated, and thereby increasing the durability of the thin-film transistor 1. Moreover, the complex oxides containing at least one element from Sr, Al, Ga, Li, Na, K, Rb, and Cs in addition to Cu, Ni, or Co are capable of densely and accurately controlling holes as carriers. This enables the thin-film transistor 1 to inject holes with high electric conductivity more accurately. The same can be said for sulfides and chlorides as well as the oxides. The above-mentioned advantages can be achieved by using the surface electrode layer 22 containing at least one of sulfides and chlorides.

Among others, those mainly containing sulfides, including Cu and those mainly containing chlorides including Ag, may be used as the sulfides and chlorides, respectively. Using them enables the source electrode 20a to inject holes more efficiently. Examples of the sulfides containing Cu may be one of the following materials or a combination of two or more of them: $Cu(II)_{1-x}S$ ($0 \leq x<1$), $Cu(I)_{2(1-x)}S$ ($0 \leq x<1$), and complex sulfides containing at least one element from Sr, Al, Ga, Li, Na, K, Rb, and Cs in addition to Cu.

Examples of the chlorides containing Ag may be one of the following materials or a combination of two or more of them: $Ag(II)_{1-x}Cl$ ($0 \leq x<1$), $Ag(I)_{2(1-x)}Cl$ ($0 \leq x<1$), and complex sulfides containing at least one element from Sr, Al, Ga, Li, Na, K, Rb, and Cs in addition to Ag.

The (average) thickness of the surface electrode layer 22 is not limited, but may be as small and even as possible. This is because the electric conductivity of the oxides, sulfides, and chlorides is lower than that of individual metals contained in them. Specifically, the (average) thickness of the surface electrode layer 22 may be within the range from 0.1 to 50 nm, and preferably from 0.5 to 10 nm. On one hand, the surface electrode layer 22 that is too thin may result in failing, to increase efficiency in injecting holes, and to prevent, an organic layer coming in contact with the source electrode 20a and the drain electrode 20b, from being altered and deteriorated depending on the content of the oxides, sulfides, and chlorides. On the other hand, the surface electrode layer 22 that is too thick may extremely decrease the conductivity of the source electrode 20a and the drain electrode 20b.

The larger amount of the oxides, sulfides, or chlorides contained in the surface electrode layer 22, the better. Specifically, the content may be 50 wt % or more, and preferably 75 wt % or more. The surface electrode layer 22 containing the oxides, sulfides, or chlorides, less than the above-mentioned amount, may result in failing to increase efficiency in injecting holes and to prevent an organic layer coming in contact with the source electrode 20a and the drain electrode 20b from being altered and deteriorated depending on the thickness of the surface electrode layer 22. The (average) thickness of the source electrode 20a and the drain electrode 20b is not limited, but may be within the range from 10 to 2000 nm, and preferably from 50 to 1000 nm.

The organic semiconductor layer 30, which is an organic layer having a function of transporting holes, is provided so as to come in contact with the source electrode 20a and the drain electrode 20b. The organic semiconductor layer 30 is mainly made of a p-type organic semiconductor material. As the p-type organic semiconductor material, both polymer organic semiconductor materials and low-molecular-weight organic semiconductor materials can be used here.

Examples of the polymer organic semiconductor materials may include the following: poly(3-alkylthiophene), poly(3-hexylthiophene) (P3HT), poly(3-octylthiophene), poly(2,5-thienylenevinylene) (PTV), poly(p-phenylenevinylene) (PPV), poly(9,9-dioctylfluorene) (PFO), poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole) (BT), fluorine-triallylamine copolymer, triallylamine polymer, fluorine-bithiophene copolymer, such as poly(9,9-dioctylfluorene-co-bithiophene) (F8T2).

Examples of the low-molecular-weight organic semiconductor materials may include the following: C60; metal phthalocyanines and their substituted derivatives; acene molecule materials, such as anthracene, tetracene, pentacene, and hexacene; alpha-oligothiophenes, such as quarterthiophene (4T), sexithiophene (6T), octithiopene (8T), dihexylquaterthiophene (DH4T), and dihexylsexithiophene (DH6T).

As the p-type organic semiconductor material, the polymer organic semiconductor materials may be used as its major component. Using the polymer organic semiconductor materials as the major component of the p-type organic semiconductor material makes it possible to form the film of the organic semiconductor layer 30 more easily and economically. The (average) thickness of the organic semiconductor layer 30 is not limited, but maybe within the range from 0.1 to 1000 nm. Preferably, it is from 1 to 500 nm, and further preferably, it is from 1 to 100 run.

On the insulating layer 30, the gate insulating layer 40 may be provided. Examples of materials of the gate insulating layer 40 are any organic and inorganic materials as long as they are suitable gate insulator materials. These organic materials may be one of the following materials or a combination of two or more of them: polymethylmethacrylate, polyvinylphenol, polyimide, polystyrene, polyvinyl alcohol, and polyvinyl acetate.

The inorganic materials may be one of the following materials or a combination of two or more of them: silica, silicon nitride, metal oxides, such as aluminum oxide and tantalum oxide, metal complex oxides, such as barium strontium titanate and lead zirconium titanate. The (average) thickness of the gate insulating layer 40 is not limited, but may be within the range from 10 to 5000 nm, and more preferably from 50 to 1000 run. Making the thickness of the gate insulating layer 40 within these ranges makes it possible to reduce operation voltages of the thin-film transistor 1, while reliably insulating the source electrode 20a and the drain electrode 20b from the gate electrode 50. Here, the gate insulating layer 40 may be made up of either a single layer or multiple layers.

The gate electrode 50 is provided on a specific position on the gate insulating layer 40, that is, corresponding to a region between the gate electrode 20a and the drain electrode 20b. Materials of the gate electrode 50 are not limited, and various known electrode materials can be used. For example, Cr, Al, Ta, Mo, Nb, Cu, Ag, Au, Pd, In, Ni, Nd, Co, metal materials, such as alloys containing the above-mentioned metals, and their oxides can be used. The gate electrode 50 may also be made of conductive organic materials.

The (average) thickness of the gate electrode 50 is not limited. It may be from 0.1 to 2000 nm, and preferably from 1 to 1000 nm. With a voltage applied in between the source electrode 20a and the drain electrode 20b of this thin-film transistor 1, applying a gate voltage to the gate electrode 50 makes a channel in the organic semiconductor layer 30 near the interface with the gate insulating layer 40. As carriers (holes) move in this channel region, a current flows between the source electrode 20a and the drain electrode 20b.

Specifically, when a voltage is applied in between the source electrode 20a and the drain electrode 20b with no voltage being applied to the gate electrode 50, only a small amount of current flows, since there are few carriers in the organic semiconductor layer 30. When a voltage is applied to the gate electrode 50, charges are induced in an area of the organic semiconductor layer 30 that faces the gate insulating layer 40, and thereby forming a channel or a path of carriers. If a voltage is applied in between the source electrode 20a and the drain electrode 20b in this state of things, a current flows through the channel region. Now, a method to manufacture the thin-film transistor 1 will be described.

A first method to manufacture the thin-film transistor 1 shown in FIG. 1 includes the following: A1 to form the source electrode 20a and the drain electrode 20b on the substrate 10, A2 to form the organic semiconductor layer 30 so as to cover the source electrode 20a and the drain electrode 20b, A3 to form the gate insulating layer 40 on the organic semiconductor layer 30, and A4 to form the gate electrode 50 on the gate insulating layer 40.

A1 Forming Source and Drain Electrodes

A1-1 Forming an Underlying Electrode Layer

Figure 2:
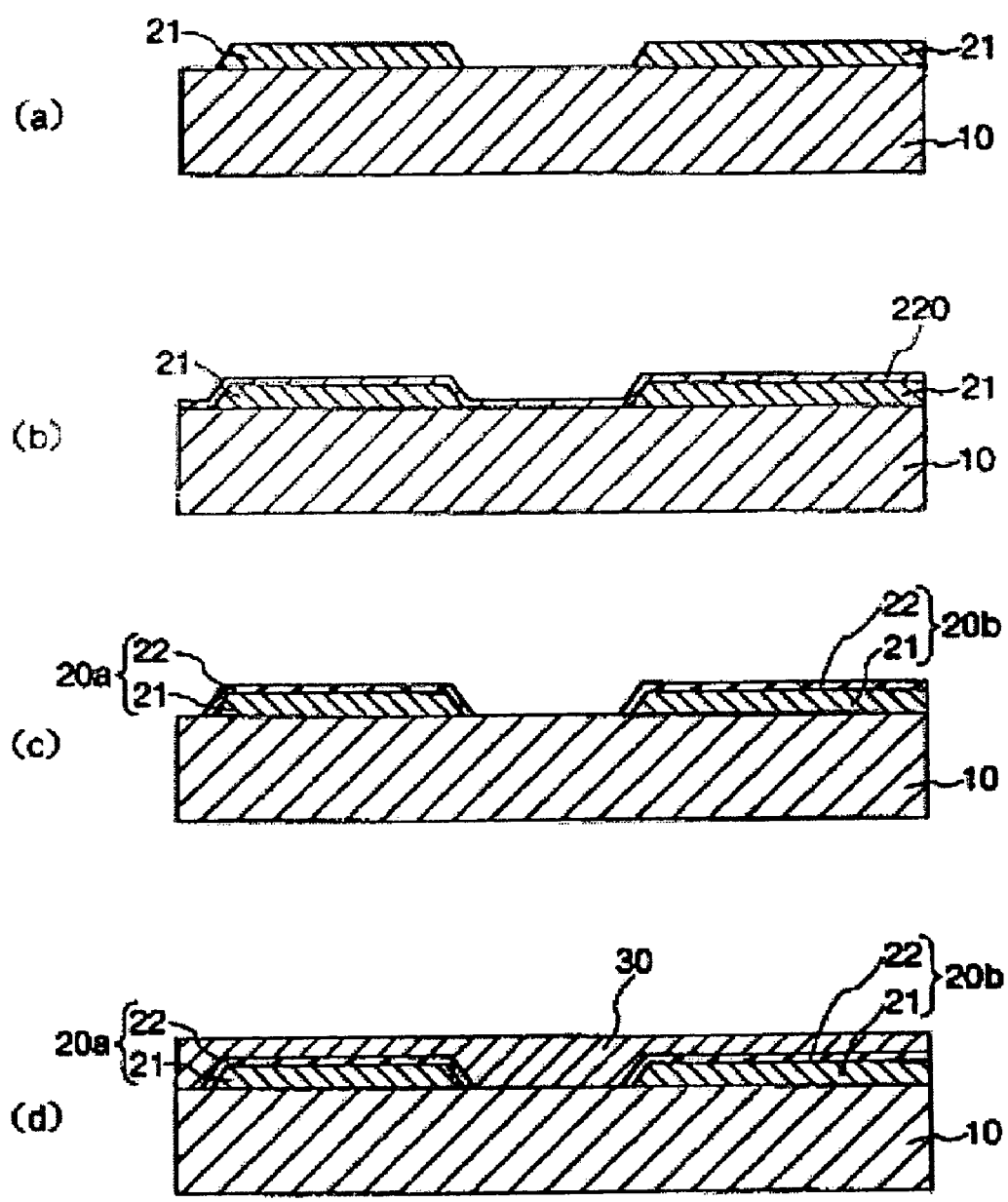
FIG. 2(a)-(d) are schematics illustrating a method for manufacturing the thin-film transistor shown in FIG. 1.

First, the underlying electrode layer 21 is formed on the substrate 10 as shown in FIG. 2(a). The underlying electrode layer 21 is formed, for example, by etching or liftoff.

When employing etching to form the underlying electrode layer 21, first a metal film (metal layer) is deposited to a thickness from 10 nm to 10 μm on the whole surface of the substrate 10 by sputtering, vapor deposition, or plating, for example. Next, a resist layer is formed on the surface of the metal film by photoresist or microcontact printing, for example. Then, the metal film is etched and patterned to have a specific pattern by using the resist layer as a mask. Alternatively, when employing liftoff to form the underlying electrode layer 21, a resist layer is first formed so as to cover the whole area other than a portion where the underlying electrode layer 21 is to be provided. Then, a metal film (metal layer) is deposited to a thickness from 10 nm to 10 μm on the whole surface of the substrate 10 on the resist layer side by vapor deposition or plating, for example. Subsequently, the resist layer is removed.

A1-2 Forming a Surface Electrode Layer

Next, the surface electrode layer 22, which is a layer containing an oxide, is provided so as to cover the underlying electrode layer 21. The surface electrode layer 22 is formed by depositing a material of the surface electrode layer 22 on the underlying electrode layer 21, forming a covering film (covering layer) 220, and then removing unnecessary portions of the covering film 220.

The covering film 220 is formed on the substrate 10 of the underlying electrode layer 21 side as shown in FIG. 2(b). Forming the covering film 220 is achieved by laser ablation, sputtering (e.g. reactive DC magnetron sputtering), chemical vapor deposition (CVD), or vapor deposition, for example. Specifically, the covering film 220 containing a Cu oxide, Ni oxide, Co oxide, or Ag oxide is formed by reactive DC magnetron sputtering with Cu, Ni, Co, or Ag used as a target in the following manner.

Pressure in a chamber before introducing gas in it (ultimate vacuum) may be $1 \times 10^{-2}$ Pa or less, and preferably $1 \times 10^{-3}$ Pa or less. The introduced gas may be a mixture of oxygen gas and inert gas (e.g. argon, helium). Pressure in a chamber after introducing the gas in it (pressure applied when forming a film) may be from 0.1 to 10 Pa, and preferably from 0.5 to 5 Pa. The power of DC may be from 10 to 200 W, and preferably from 20 to 100 W.

The mixture ratio of oxygen and inert gasses is appropriately set under the above-mentioned conditions. This makes it possible to have a desirable mixture ratio of oxides and metals in the covering film 220 (surface electrode layer 22). By using sulfur gas, such as hydrogen sulfide instead of oxygen gas, the covering film 220 containing a sulfide can be formed. By using chloride gas, such as hydrogen chloride or chlorine, the covering film 220 containing a chloride can be formed.

The covering film 220 containing a complex oxide, such as $SrCu_2O_2$, $CuAlO_2$, and $CuGaO_2$ as its major component may be formed by laser ablation with a complex oxygen sintered body corresponding to the complex oxygen to be deposited as a target and with oxygen gas supplied in the following manner. Pressure in a chamber before introducing gas in it (ultimate vacuum) may be $1 \times 10^{-4}$ Pa or less, and preferably $1 \times 10^{-6}$ Pa or less.

As laser light for irradiation, a pulsed light whose wavelength is around 150 to 300 nm and whose pulse length is around from 1 to 30 ns may be used. Specifically, ArF excimer laser and KrF excimer laser may be used. The energy density of the laser light may be 1 $J/cm^2$ or more, and preferably around from 2 to 6 $J/cm^2$.

Pressure in a chamber after introducing the oxygen gas in it (pressure applied when forming a film) may be from 0.1 to 100 Pa, and more preferably from 1 to 10 Pa. The covering film 220 containing a chloride may be formed by distributing power to the underlying electrode layer 21 in a hydrogen chloride solution, for example, in order to perform electrolysis and deposit the chloride on the surface of the underlying electrode layer 21.

When using a flexible substrate, such as a plastic substrate as the substrate 10, a process to promote the crystallization of the covering film 220, for example by light irradiation, may be performed. Here, when using a solid substrate, such as a quartz substrate as the substrate 10, the covering film 220 with high crystallization can be formed by heating the substrate 10 to reach a temperature from 200 to 800 degrees centigrade to form a film.

Next, a resist layer having a shape corresponding to the source electrode 20a and the drain electrode 20b is formed, for example, by photolithography or microcontact printing. This resist layer serves as a mask to remove unnecessary portions of the covering film 220 as shown in FIG. 2(c). Thus the surface electrode layer 22 is formed on the underlying electrode layer 21, and thereby completing the source electrode 20a and the drain electrode 20b.

In order to remove the covering film 220, one of the following methods or a combination of two or more of them can be used: physical etching processes, such as plasma etching, reactive ion etching, beam etching, photo-assisted etching; and chemical etching processes, such as wet etching. This way the source electrode 20a and the drain electrode 20b are formed that are capable of controlling the amount of oxides contained in the surface electrode layer 22 with comparative accuracy. This can be achieved by simple processing, such as controlling the amount of oxides contained in a vapor deposition source and target, or controlling the amount of oxygen gases introduced into an atmosphere in which a film is formed. Also by simple processing of controlling the amount of the sulfur or chloride gas introduced into an atmosphere in which a film is formed, it is possible to control the amount of sulfides or chlorides contained in the surface electrode layer 22 with comparative accuracy. Accordingly, it is possible to easily and accurately adjust properties, such as work functions of the source electrode 20a and the drain electrode 20b.

A2 Forming an Organic Semiconductor Layer

Then, the organic semiconductor layer 30 is formed so as to cover the source electrode 20a and the drain electrode 20b as shown in FIG. 2(d). Here, a channel region is formed in between the source electrode 20a and the drain electrode 20b. The organic semiconductor layer 30 may be made of a polymer organic semiconductor material, for example, by application methods, such as spin coating and dipping, or printing methods, such as ink jetting and screen printing.

The organic semiconductor layer 30 may be made of a low-molecular-weight organic semiconductor material that is solubilized by vapor deposition or using a precursor. Specifically, a coating film is formed by, for example, application methods, such as spin coating and dipping, or printing methods, such as ink jetting and screen printing, and then the coating film is processed by anneal processing.

The area in which the organic semiconductor layer 30 is formed is not limited to what is described in the drawing. The organic semiconductor layer 30 may be formed only in a region (channel region) between the source electrode 20a and the drain electrode 20b. When providing more than one thin-film transistor 1 (element) on the same substrate, this makes it possible to form the organic semiconductor layer 30 of each element independently, and thereby reducing crosstalk among the elements. Also, this also reduces the amount of the organic semiconductor material that is used, and thereby cutting manufacturing cost.

A3 Forming a Gate Insulating Layer

Figure 3:
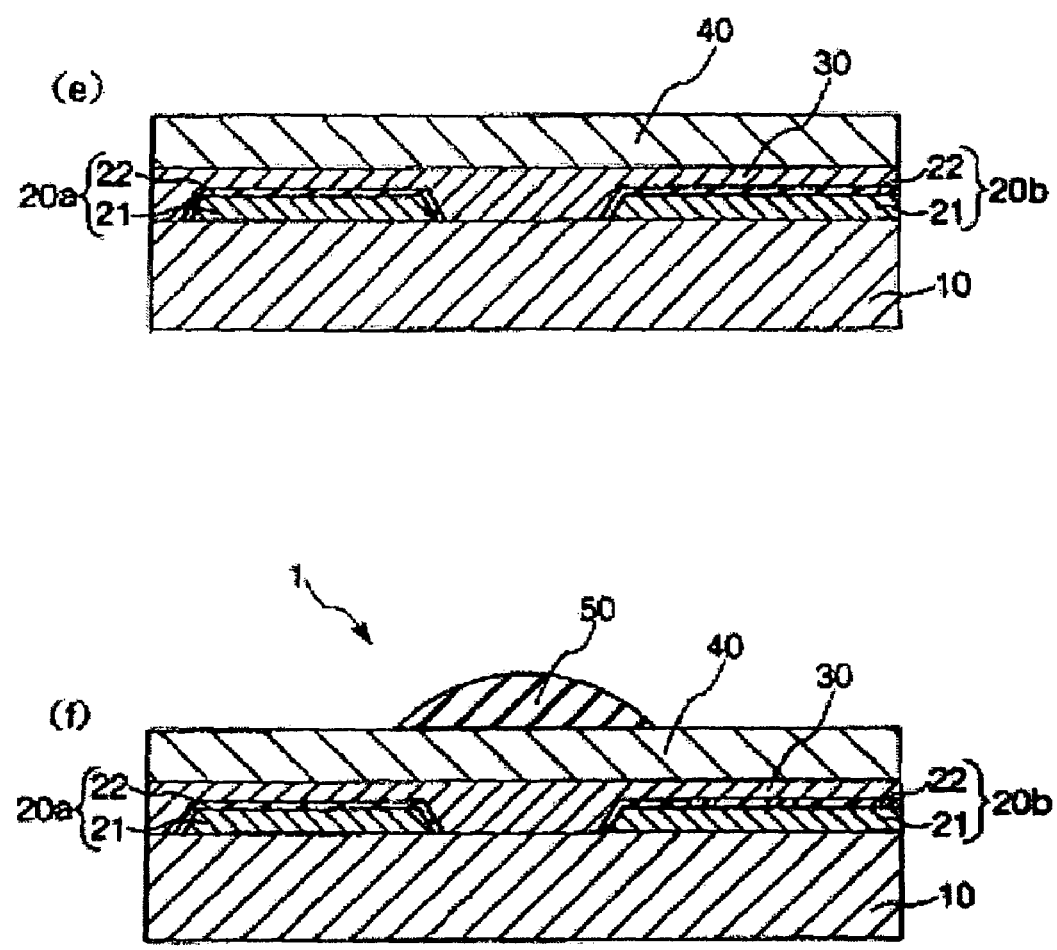
FIGS. 3(e)-3(f) are schematics illustrating the method for manufacturing the thin-film transistor shown in FIG. 1.

Next, the gate insulating layer 40 is formed on the organic semiconductor layer 30 as shown in FIG. 3(e). The gate insulating layer 40 may be formed of an organic polymer material by applying the organic polymer material or a solution containing its precursor so as to cover the organic semiconductor layer 30, and then providing a necessary treatment (e.g. heating, irradiation of infrared rays, application of ultrasonic waves) to this coating film.

The organic polymer material or solution containing its precursor is applied to the organic semiconductor layer 30 by the application and printing methods mentioned in A2. The gate insulating layer 40 may also be formed with an inorganic material by thermal oxidation, CVD, or spin-on glass (SOG). It is possible to form a silica film and a silicon nitride film as the gate insulating layer 40 through wet processing using polysilazane as a material.

A4 Forming a Gate Electrode

Next, the gate electrode 50 is formed on the gate insulating layer 40 as shown in FIG. 3(f). First, a metal film (metal layer) is formed. This can be achieved by the following methods, for example: chemical vapor deposition (CVD) including plasma CVD, thermal CVD, and laser CVD; vacuum deposition; sputtering (low-temperature sputtering); dry plating, such as ion plating; wet plating including electrolytic plating, immersion plating, and electroless plating; spraying; sol-gel processing; metalorganic deposition; and joining of metal foil.

A resist material is applied to the metal film, and hardened. Thus the resist layer having a shape corresponding to the gate electrode 50 is formed. This resist layer serves as a mask to remove unnecessary portions of the metal film. In order to remove the metal film, one of the following methods or a combination of two or more of them can be used: physical etching processes, such as plasma etching, reactive ion etching, beam etching, photo-assisted etching; and chemical etching processes, such as wet etching.

Subsequently, the resist layer is removed, which completes the gate electrode 50. The gate electrode 50 may also be formed by applying a conductive material containing conductive particles or a conductive organic material to the gate insulating layer 40, and then providing a necessary treatment (e.g. heating, irradiation of infrared rays, application of ultrasonic waves) to this coating film. Examples of the conductive material containing conductive particles include solutions in which metal microparticles are dispersed and polymer mixtures containing conductive particles. Examples of the conductive material containing a conductive organic material include a solution or dispersion liquid of the conductive organic material.

To apply the conductive material to the gate insulating layer 40, one of the following methods or a combination of two or more of them can be used: application methods, such as spin coating, casting, micro gravure coating, gravure coating, bar coating, roll coating, wire-bar coating, dip coating, and spray coating; and printing methods, such as screen printing, flexographic printing, offset printing, ink jetting, and microcontact printing. Thus the thin-film transistor 1 of the first exemplary embodiment is formed.

While the source electrode 20a and the drain electrode 20b are composed of two layers, that is, the underlying electrode layer 21 and the surface electrode layer 22 in this exemplary embodiment, it is possible to have one or more layers in between the underlying electrode layer 21 and the surface electrode layer 22 and on the underlying electrode layer 21 on the substrate 10 for particular purposes. For enhancing adhesiveness, for example. In this case, the layer closest to the organic semiconductor layer 30 (i.e. the outermost layer) has the biggest work function among a plurality of layers. In this way, it is possible to inject holes into the organic semiconductor layer 30 more efficiently.

Also, the structure of the source electrode 20a is not limited to the above-mentioned one. The drain electrode 20b may have a different structure from the source electrode 20a. In order to reduce manufacturing cost, the source electrode 20a and the drain electrode 20b may have the same structure. Furthermore, it is possible to have one or more layers for a particular purpose in between the source electrode 20a and the drain electrode 20b, and the organic semiconductor layer 30; between the organic semiconductor layer 30 and the gate insulating layer 40; and between the gate insulating layer 40 and the gate electrode 50.

Second Exemplary Embodiment

A thin-film transistor according to a second exemplary embodiment of the present invention will now be described.

Figure 4:
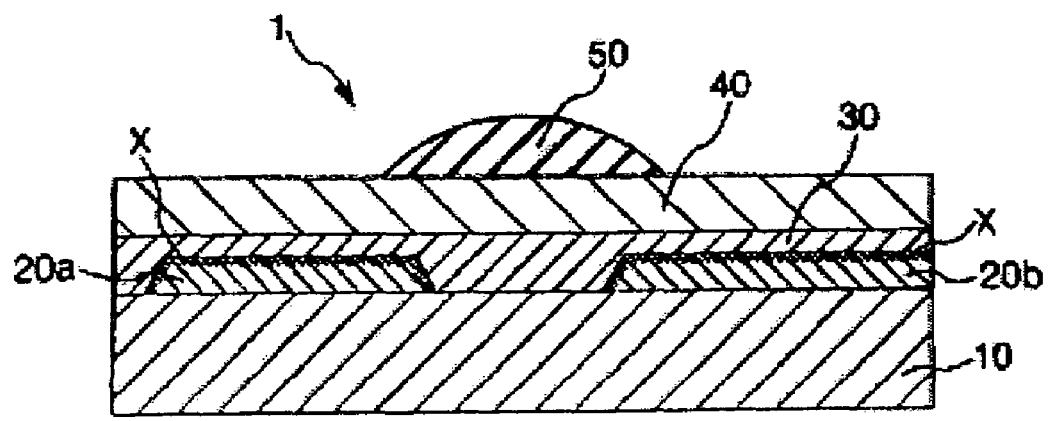
FIG. 4 is a schematic showing a thin-film transistor according to a second exemplary embodiment of the present invention.
Figure 5:
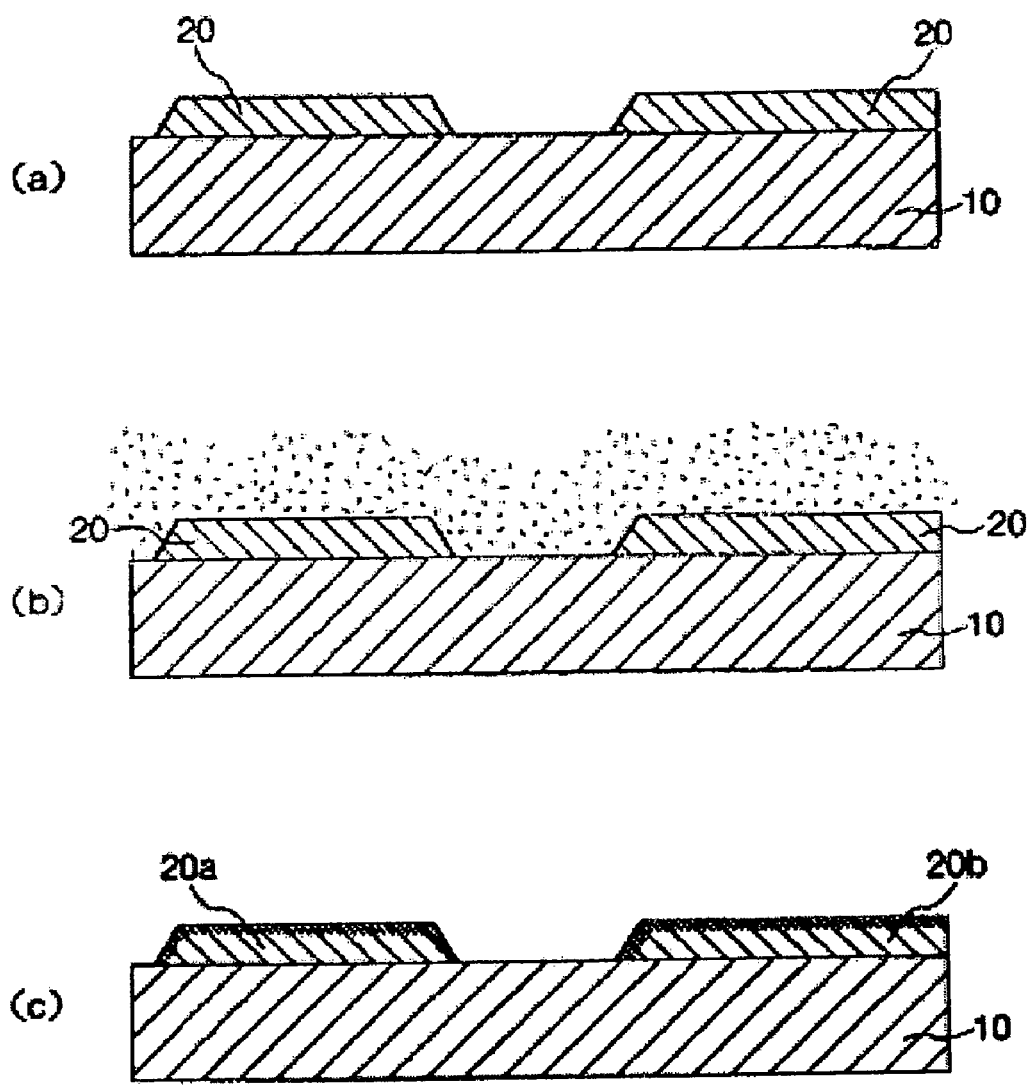
FIGS. 5(a)-5(c) are schematics illustrating the method for manufacturing the thin-film transistor shown in FIG. 4.

FIG. 4 is a schematic showing the thin-film transistor according to the second exemplary embodiment of the present invention. FIGS. 5(*a*)-5(*c*) are schematics illustrating a method to manufacture the thin-film transistor shown in FIG. 4. The thin-film transistor according to the second exemplary embodiment will be described below, mainly in terms of differences from the thin-film transistor according to the first exemplary embodiment. The description of what the two have in common will be omitted.

The thin-film transistor 1 of the second exemplary embodiment has the source electrode 20a and the drain electrode 20b of different structures from those included in the thin-film transistor 1 of the first exemplary embodiment, which is the only difference between the two. Here, each of the source electrode 20a and the drain electrode 20b has a single-layer structure. At least on the organic semiconductor layer 30 side (hereinafter called near-surface, having a given thickness including the surface shown in FIG. 4), each of the source electrode 20a and the drain electrode 20b has at least either of the following: an oxide containing at least one of Cu, Ni, and Co, or an oxide containing Ag; or a sulfide or chloride.

Like the first exemplary embodiment, examples of the oxide may be one of the following or a combination of two or more of them: Cu oxides represented by $Cu(II)_{1-x}O$ ($0 \leq x < 1$) or $Cu(I)_{2(1-x)}O$ ($0 \leq x < 1$), Ni oxides represented by $Ni_{1-x}O$ ($0 \leq x < 1$), Co oxides represented by $Co_{1-x}O$ ($0 \leq x < 1$), Ag oxides represented by $Ag(II)_{1-x}O$ ($0 \leq x < 1$) or $Ag(I)_{2(1-x)}O$ ($0 \leq x < 1$), and complex oxides containing at least one element from Sr, Al, Ga, Li, Na, K, Rb, and Cs to be added to the above-mentioned oxides in addition to the already contained Cu, Ni, and Co.

Also like the first exemplary embodiment, those mainly containing sulfides, including Cu, and those mainly containing chlorides, including Ag, may be used as the sulfide and chloride, respectively. In the source electrode 20a and the drain electrode 20b of the present exemplary embodiment, a portion containing an oxide, sulfide, or chloride (portion X in FIG. 4) may contain 50 wt % or more of such an oxide, sulfide, or chloride, and preferably contains around 75 wt %. The (average) thickness of the portion X may be within the range from 0.1 to 50 nm, and preferably from 0.5 to 10 nm. Now, a method to manufacture the thin-film transistor 1 will be described.

B1 Forming Source and Drain Electrodes

First, a metal film (metal layer) 20 to be the source electrode 20a and the drain electrode 20b is formed on the substrate 10 as shown in FIG. 5(*a*). While the metal film 20 may be formed in the same manner as described in the first exemplary embodiment (forming of the underlying electrode layer 21), may be formed by wet plating. Plating makes it possible to accurately form a film of the metal film 20 with a desired thickness without using a complicated device, such as vacuum equipment. As the plating, electroless plating may be used. This makes it possible to further increase accuracy in forming a film of the metal film 20.

Next, the metal film 20 is treated to be oxidized as shown in FIG. 5(*b*). The near-surface of the metal film 20 is oxidized, generating an oxide corresponding to the material of the metal film 20. As a result, the source electrode 20a and the drain electrode 20b containing the oxide on their near-surface are completed. While the oxide may be selected from the above-mentioned ones, the metal film 20 is made of mainly Cu, Ni, Co, an alloy containing these, Ag, or an alloy containing Ag. Examples of the alloy may include the following: Cu—Ni alloy, Cu—Co alloy, Ni—Co alloy, an alloy of at least one selected from Cu, Ni, Co, and Ag, and at least one selected from Sr, Al, Ga, Li, Na, K, Rb, and Cs.

Using electroless plating to form the metal film 20 makes it possible to easily and reliably achieve a desired composition. Examples of the oxidation may be one of the following or a combination of two or more of them: oxygen plasma treatment, in which plasma treatment is provided in the presence of oxygen; thermal oxidation; and anode oxidation.

Among others, oxygen plasma treatment may be used as the oxidation. This enables the source electrode 20a and the drain electrode 20b to evenly contain an oxide on their near-surface. Accordingly, it is possible to evenly inject holes into the organic semiconductor layer 30. Furthermore, oxygen plasma treatment also makes it possible to remove organic matters on the surface of the metal film 20, while providing the oxidation of the metal film 20.

Thus, the gate electrode 20a with high efficiency in injecting holes into the organic semiconductor layer 30 is completed. Here, the oxygen plasma treatment may be conducted under reduced pressure (in vacuum), it may be conducted at an atmospheric pressure. Accordingly, the oxidation of the metal film 20 is easily and economically conducted.

The source electrode 20a and the drain electrode 20b containing a sulfide on their near-surface may be formed by, for example, treating the metal film 20 with heat under predetermined conditions in the presence of sulfur, such as hydrogen sulfide. The source electrode 20a and the drain electrode 20b containing a chloride on their near-surface may be formed by, for example, treating the metal film 20 with heat under predetermined conditions in the presence of chlorine, such as hydrogen chloride or chlorine.

B2 Forming an Organic Semiconductor Layer
The treatment in this step is the same as in A2.

B3 Forming a Gate Insulating Layer
The treatment in this step is the same as in A3.

B4 Forming a Gate Electrode
The treatment in this step is the same as in A4.

Thus the thin-film transistor 1 of the second exemplary embodiment is formed. The thin-film transistor 1 of the second exemplary embodiment provides the same effects as the thin-film transistor 1 of the first exemplary embodiment.

Third Exemplary Embodiment

A thin-film transistor according to a third exemplary embodiment of the present invention will now be described.

Figure 6:
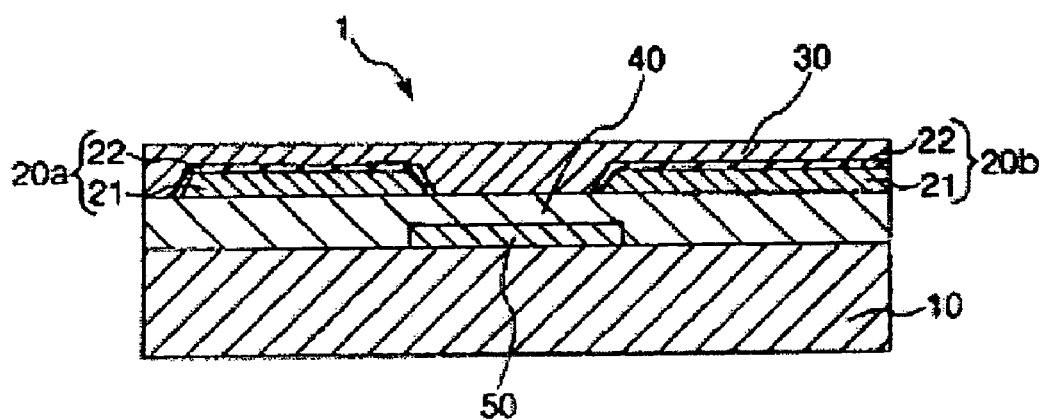
FIG. 6 is a schematic showing a thin-film transistor according to a third exemplary embodiment of the present invention.

FIG. 6 is a schematic showing the thin-film transistor of the third exemplary embodiment of the present invention. The thin-film transistor according to the third exemplary embodiment will be described below mainly in terms of differences from the thin-film transistor according to the first exemplary embodiment. The description of what the two have in common will be omitted.

The thin-film transistor 1 of the third exemplary embodiment has an overall structure that is different from that of the thin-film transistor 1 of the first exemplary embodiment, which is the only difference between the two. Specifically, the thin-film transistor 1 shown in FIG. 6 is a bottom-gate thin-film transistor in which the gate electrode 50 is provided, not on the side of the source electrode 20a and the drain electrode 20b, but on the substrate 10 side with the gate insulating layer 40 therebetween. The structure of the source electrode 20a and the drain electrode 20b is the same as that in the first exemplary embodiment.

Now, a method to manufacture the thin-film transistor 1 will be described. The method to manufacture thin-film transistor 1 shown in FIG. 6 includes the following: C1 to form the gate electrode 50 on the substrate 10, C2 to form the gate insulating layer 40 so as to cover the gate electrode 50, C3 to form the source electrode 20a and the drain electrode 20b on the gate insulating layer 40, C4 to form the organic semiconductor layer 30 so as to cover the source electrode 20a, the drain electrode 20b, and the gate insulating layer 40.

C1 Forming a Gate Electrode
The treatment in C1 is the same as in A4. For the above-mentioned reason, a metal film similar to that described in the first exemplary embodiment is formed by using, for example, etching or liftoff.

C2 Forming a Gate Insulating Layer
The treatment in C2 is the same as in A3. In C3, the underlying electrode layer 21 made of mainly Cu, Ni, Co, an alloy containing these, Ag, or an alloy containing Ag (metal materials) is formed. Therefore, the gate insulating layer 40 may be made of one of the inorganic materials mentioned in the first exemplary embodiment.

C3 Forming Source and Drain Electrodes
The treatment in C3 is the same as in A1.

C4 Forming an Organic Semiconductor Layer
The treatment in C4 is the same as in A2.

Thus the thin-film transistor 1 of the third exemplary embodiment is formed. The thin-film transistor 1 of the third exemplary embodiment provides the same effects as the thin-film transistor 1 of the first exemplary embodiment. In addition, the thin-film transistor 1 of bottom-gate type according to the third exemplary embodiment has the following advantage.

Most organic semiconductor materials are susceptible to heat, acids, and alkali compared to inorganic semiconductor materials. Using the bottom-gate thin-film transistor of the present exemplary embodiment makes it possible to form the organic semiconductor layer 30 after the gate electrode 50, the gate insulating layer 40, the source electrode 20a, and drain electrode 20b have been formed. This makes it possible to adopt optimum processing conditions, such as treatment at a higher temperature or using a strong acid, such as sulfuric acid in Steps C1 to C3. As a result, the property of the thin-film transistor 1 (switching property) can be enhanced.

Fourth Exemplary Embodiment

A thin-film transistor according to a fourth exemplary embodiment of the present invention will now be described.

Figure 7:
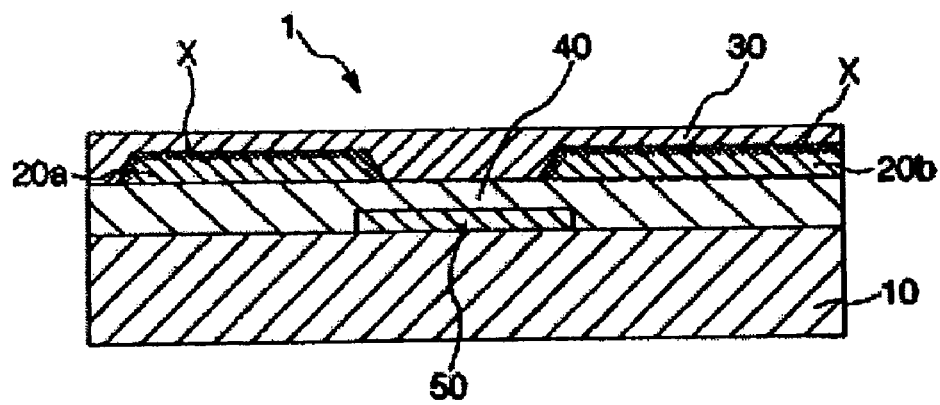
FIG. 7 is a schematic showing a thin-film transistor according to a fourth exemplary embodiment of the present invention.

FIG. 7 is a schematic showing the thin-film transistor of the fourth exemplary embodiment of the present invention. The thin-film transistor according to the fourth exemplary embodiment will be described below mainly in terms of differences from the thin-film transistor according to the first to third exemplary embodiments. The description of what they have in common will be omitted.

The thin-film transistor 1 of the fourth exemplary embodiment has an overall structure, which is the only difference from the thin-film transistor 1 of the second exemplary embodiment. Specifically, the thin-film transistor 1 shown in FIG. 7 is a bottom-gate thin-film transistor in which the gate electrode 50 is provided, not on the side of the source electrode 20a and the drain electrode 20b, but on the substrate 10 side with the gate insulating layer 40 therebetween. The structure of the source electrode 20a and the drain electrode 20b is the same as that in the second exemplary embodiment. Now, a method to manufacture the thin-film transistor 1 will be described.

D1 Forming a Gate Electrode
The treatment in D1 is the same as in C2.

D2 Forming a Gate Insulating Layer
The treatment in D2 is the same as in C2.

D3 Forming Source and Drain Electrodes

The treatment in D3 is the same as in B1.

D3 Forming an Organic Semiconductor Layer

The treatment in D4 is the same as in C4.

Thus the thin-film transistor 1 of the fourth exemplary embodiment is formed. The thin-film transistor 1 of the fourth exemplary embodiment provides the same effects as the thin-film transistor 1 of the first to third exemplary embodiments.

Organic EL Element

An organic EL element having an electrode of an exemplary aspect of the present invention will now be described.

Figure 8:
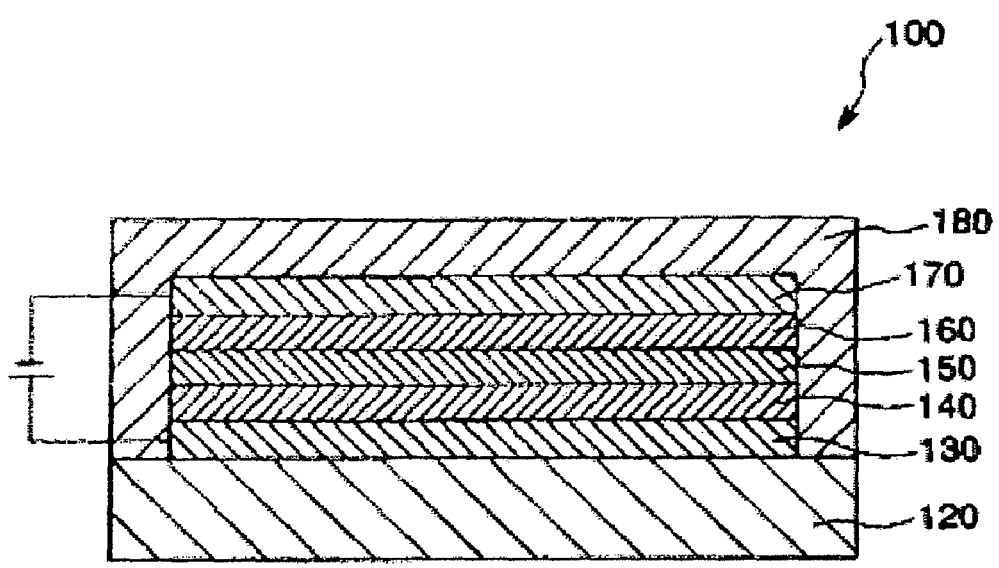
FIG. 8 is a schematic showing an organic EL element according to an exemplary embodiment of the present invention.

FIG. 8 is a schematic showing an organic EL element of an exemplary aspect of the present invention. An organic EL element 100 shown in FIG. 8 includes a substrate 120. On the substrate 120, an anode 130, a hole transport layer 140, an emitting layer 150, an electron injection layer 160, and a cathode 170 are provided in this order. The organic EL element 100 also includes a sealing member (protective member)180 that covers the layers 130 through 170.

The organic EL element 100 has top emission structure, in which light from the emitting layer 150 is taken out and is visible on the cathode 170 side. According to the present exemplary embodiment, the hole transport layer 140 and the emitting layer 150 make up an organic electroluminescent layer (organic EL layer). The substrate 120 supports the organic EL element 100.

Examples of the material of the substrate 120 may include a plastic substrate (resin substrate) containing polyethylene terephthalate (PET), polyethylene naphthalate (PEN), polyethersulphone (PES), aromatic polyester (liquid crystal polymer), polyimide (PI), polypropylene (PP), polyamide (PA), cycloolefin polymer (COP), polymethyl methacrylate (PMMA), polycarbonate (PC), polyarylate (PAR) or the like; glass substrate; quartz substrate; silicon substrate, metal substrate; and gallium arsenide substrate.

The average thickness of the substrate 120 is not limited. It may be from 0.1 to 30 nm, and preferably from 0.1 to 10 nm. In order to provide flexibility to the organic EL element 100, the substrate 120 may be a plastic substrate or a thin metal substrate whose thickness is comparatively small. The anode 130 (i.e. the electrode of an exemplary aspect of the present invention) is an electrode injecting holes into the hole transport layer 140. The anode 130 has a similar structure to the source electrode 20a included in the thin-film transistor 1 of the first through fourth exemplary embodiments.

If the anode 130 has a single-layer structure, the anode 130 contains at least either of an oxide including at least one of Cu, Ni, or Co; or a sulfide or chloride at least on its surface (on the hole transport layer 140 side). If the anode 130 has a multiple-layer structure, the anode 130 contains at least either of an oxide including at least one of Cu, Ni, or Co; or a sulfide or chloride at least on its outermost layer (the layer closest to the hole transport layer 140). This increases efficiency in injecting holes into the hole transport layer 140, and thereby providing the organic EL element 100 that is reliable with high luminance.

The (average) thickness of the anode 130 is not limited, but may be within the range from 10 to 2000 nm, and more preferably from 50 to 1000 nm. If the anode 130 is too thin on one hand, the anode 130 may possibly not fulfill its function. On the other hand, the anode 130 that is thicker than the above-mentioned range does not mean that it produces better effects. The hole transport layer 140 has a function of transmitting holes injected from the anode 130 to the emitting layer 150. The hole transport layer 140 is mainly made of a p-type organic semiconductor material. As the p-type organic semiconductor material, both polymer organic semiconductor materials and low-molecular-weight organic semiconductor materials can be used here.

Examples of the organic semiconductor materials may include the following polymer organic semiconductor materials, in addition to the materials mentioned above to form the organic semiconductor layer 30 in the thin-film transistor 1: poly(3,4-ethylene dioxythiophene/styrenesulfonate) (PEDOT/PSS), poly thiophene, poly(thiophene vinylene), poly (2,2'-thienylpyrrole), and polyaniline.

Examples of low-molecular-weight organic semiconductor materials may include the following: 1,1-bis(4-di-p-tolylaminophenyl)-cyclohexane; 1,1'-bis(4-di-p-tolylaminophenyl)-4-phenyl-cyclohoxane; 4,4',4"-trimethyl triphenylamine; N,N,N',N'-tetraphenyl-1,1'-biphenyl-4,4'-diamine; N,N'-diphenyl-N,N'-bis(3-methylphenyl)-1, 1'diphenyl-4,4'-diamine (TPD1); N,N'-diphenyl-N,N'-bis(4-methoxyphenyl)-1,1'-biphenyl-4,4'-diamine (TPD2); N,N, N',N'-tetrakis(4-methoxyphenyl)-1,1'-biphenyl-4,4'-diamine (TPD3); N,N'-di(1-naphtyl)-N,N'-diphenyl-1,1'-biphenyl-4, 4'-diamine (alpha-NPD); N,N,N',N'-tetraphenyl-p-phenylenediamine; N,N,N',N'-tetra(p-tolyl)-p-phenylenediamine; N,N,N',N'-tetra(m-tolyl)-m-phenylenediamine; carbazole; N-isopropyl carbazole; N-phenylcarbazole; 4-di-p-tolylaminostilbene; triphenylmethane; 1-phenyl-3-(p-dimethylaminophenyl)pyrazoline; 1,3,4-oxadiazole; 2,5-di(4-dimethylaminophenyl)-1,3,4-oxadiazole; 9-(4-diethylaminostyryl)anthracene; fluorenone; 2,4,7-trinitro-9-fluorenone; 2,7-bis(2-hydroxy-3-(2-chlorophenylcarbamoyl)-1-naphthylazo)fluorenone; 1,4-dithioketo-3,6-diphenyl-pyrrolo-(3,4-c)-pyrrolopyrrole; porphyrin; metal tetraphenylporphyrin; quinacridone; copper naphthalocyanine; vanadyl naphthalocyanine; monochlorogallium naphthalocyanine; N,N'-di(naphthalene-1-yl)-N,N'-diphyenyl-benzidine; and N,N,N',N'-tetraphenylbenzidine.

As the p-type organic semiconductor material, the polymer organic semiconductor materials may be used as its major component. Using the polymer organic semiconductor materials as the major component of the p-type organic semiconductor material makes it possible to form the film of the organic hole transport layer 140 more easily and economically. The average thickness of the hole transport layer 140 is not limited, but may be within the range from 0.1 to 1000 nm. Preferably it is from 1 to 500 nm, and further preferably, it is from 1 to 100 nm. If the hole transport layer 140 is too thin on one hand, a pin hole may possibly be developed. On the other hand, if the hole transport layer 140 is too thick, the transmission of the hole transport layer 140 may decline, which will possible change the chromaticity (hue) of light emitted from the organic EL element 100.

When distributing power (applying a voltage) to the anode 130 and the cathode 170, which will be described later, holes and electrons are injected into the emitting layer 150 through the hole transport layer 140 and the electron injection layer 160, respectively. The holes and electrons are recombined in the emitting layer 150. The energy released by the recombination generates excitons, which release (or emit) energy (or fluorescent light and phosphorescence) when turning back to the ground state. This way the emitting layer 150 emits light.

The light is emitted to the cathode 170 and the anode 130. However, since the anode 130 of the above-mentioned structure tends to have high light reflectivity, the light originally emitted to the anode 130 reflects on the anode 130 and is emitted from the cathode 170. According to the present exemplary embodiment, using the organic EL element 100 having top emission structure increases efficiency in emitting light. Any materials (light-emitting material) can be used for the emitting layer 150 as long as they inject holes in the anode 130 and electrons in the cathode 170 when applying a voltage, and provide a space where the holes and electrons are recombined. Both low-molecular-weight light-emitting materials and polymer light-emitting materials can be used for this purpose.

Mainly using a low-molecular-weight light-emitting material as the light-emitting material makes the composition of the emitting layer 150 dense, and thereby enhancing efficiency in emitting light from the emitting layer 150. Mainly using a polymer light-emitting material makes it comparatively easy to dissolve the material into a solvent, which means that it is easy to form a film of the emitting layer 150 by various application methods, such as ink jetting.

Examples of the low-molecular-weight light-emitting material include the following: distyryl benzene (DSB); diaminodistyryl benzene (DADSB); naphthalene; nile red; phenanthrene; chrysene; 6-nitrochrysene; perylene; N,N'-bis (2,5-di-t-butylphenyl)-3,4,9,10-perylene-di-carboxyimide (BPPC); coronene; anthracene; bisstyrylanthracene; pyrene; 4-(dicyanomethylene)-2-methyl-6-(p-dimethylami-
nostyryl)-4H-pyran (DCM); acridine; stilbene; 2,5-dibenzoxazolethiophene; benzoxazole; benzoimidazole; 2,2'-(p-phenylenedivinylene)-bisbenzothiazole; bistyryl (1,4-diphenyl-1,3-butadiene); tetraphenylbutadiene; naphthalimide; coumarin; perinone; oxadiazole; 1,2,3,4,5-pentaphenyl-1,3-cyclopentadiene (PPCP); quinacridone; quinacridone red; pyrrolopyridine; thiadiazolopyridine; 2,2', 7,7'-tetraphenyl-9,9'-spirobifluorene; tris(8-hydroxyquinolinolato)aluminum($Alq_3$); tris(4-methyl-8-quinolinolato)aluminum(E) ($Almq_3$); (8-hydroxyquinolinolato)zinc ($Znq_2$); (1,10-phenanthroline)-tris-(4,4,4-trifluoro-1-(2-thienyl)-butane-1,3-dionate)europium(III) ($Eu(TTA)_3(phen)$); fac tris(2-phenylpyridine)iridium ($Ir(ppy)_3$); and (2,3,7,8,12,13,17, 18-octaethyl-21H,23H-porphine)platinum(II).

Examples of the polymer light-emitting material include the following: poly(9,9-dioctylfluorene) (F8); poly(9,9-dioctylfluorene-co-bithiophene) (F8T2); poly(9,9-dioctylfluorene-co-2,1,3-benzothiadiazole) (F8BT); poly(9,9-dioctylfluorene-co-N-(4-butylphenyl)diphenylamine) (TFB); trans-polyacetylene; cis-polyacetylene; poly(diphenylacetylene) (PDPA); poly(p-phenylenevinylene) (PPV); poly(2,5-dialkoxy-p-phenylenevinylene) (RO-PPV); cyano-substituted-poly(p-phenylenevinylene) (CN-PPV); poly(2-dimethyloctylsilyl-p-phenylenevinylene) (DMOS-PPV); poly(2-methoxy,5-(2'-ethylhexyloxy)-p-phenylenevinylene) (MEH-PPV); poly(oxypropylene)triol (POPT); alpha, omega-bis[N,N'-di(methylphenyl)aminophenyl]-poly[9,9-bis(2-ethylhexyl)fluoren-2,7-diyl] (PF2/6 am4); poly(9,9-dioctyl-2,7-divinylenefluorenylene-alt-co(anthracene-9,10-diyl); poly(p-phenylene) (PPP); poly(1,5-dialkoxy-p-phenylene) (RO—PPP); poly(N-vinylcarbazole) (PVK); poly(methylphenylsilane) (PMPS); poly(naphthylphenylsilane) (PNPS); and poly(biphenylylphenylsilane) (PBPS).

The average thickness of the emitting layer 150 is not limited. It may be from 5 to 1000 nm, and preferably from 10 to 100 nm. Setting the thickness of the emitting layer within the ranges makes it possible to enhance efficiency in emitting light from the emitting layer 150.

The electron injection layer 160 has a function of transmitting electrons injected from the cathode 170 to the emitting layer 150. A metal material with a small work function may be used to form the electron injection layer 160. Examples of the material include the following: Mg, Ca, Sr, La, Ce, Er, Eu, Sc, Y, Yb, Ag, Cu, Al, Cs, Rb, alloys containing these, and their fluorides.

Since the organic EL element 100 of the present exemplary embodiment has a top emission structure, which means that light emitted from the emitting layer 150 is visible on the cathode 170 side, the electron injection layer 160 may be as thin as possible. The (average) thickness of the electron injection layer 160 is not limited, but may be within the range from 5 to 100 nm, and preferably from 20 to 50 nm. If the electron injection layer 160 is too thin on one hand, a pin hole may possibly be developed, causing a short circuit. On the other hand, if the electron injection layer 160 is too thick, the value of resistance may possibly be too high depending on its material.

The cathode 170 is an electrode to inject electrons into the electron injection layer 160. The cathode 170 of the present exemplary embodiment is substantially transparent, that is, transparent and colorless, transparent and colored, or translucent, so that light emitted from the emitting layer 150 can be observed. Therefore, the cathode 170 may be made of a material that is conductive and allows light to pass through.

Examples of the material of the cathode 170 may be one of the following or a combination of two or more of them: transparent and conductive oxides, such as indium tin oxide (ITO), fluorine-doped ITO (FTO), indium zinc oxide (IZO), antimony tin oxide (ATO), and aluminum zinc oxide (AZO). By mainly using such transparent and conductive oxides, which have an advantage both in conductivity and transparency, to form the cathode 170, it is possible to provide the organic EL element 100 that has an advantage in efficiency in emitting light.

The (average) thickness of the cathode 170 may be within the range from 10 nm to 1 μm. If the cathode 170 is too thin on one hand, the cathode 170 may possibly not fulfill its function. On the other hand, the cathode 170 that is too thick may lower efficiency in emitting light from the organic EL element 100 and significantly reduce the transmission of light depending of its material to the extent that it cannot be practically used.

The sealing member 180 has a function of air tightly sealing each layer 130 through 170 of the organic EL element 100 so as to block oxygen and moisture. Using the sealing member 180 makes it possible to increase the reliability of the organic EL element 100 and reduce the likelihood or prevent each layer 130 through 170 (particularly the hole transport layer 140 and the emitting layer 150) from changing in quality or deteriorating. The inside of the sealing member 180 may be filled with an inert gas, such as nitrogen or rare gasses. This makes it possible to reduce the likelihood or prevent each layer 130 through 170 from changing in quality or deteriorating. Any materials allowing light to pass through can be used to form the sealing member 180. For example, various types of resin materials and glass materials can be used.

While the emitting layer 150 and the hole transport layer 140 are separately provided in the present exemplary embodiment, it is also possible to provide a hole-transport emitting layer that has functions of both the hole transport layer 140 and the emitting layer 150. In this case, a portion of the hole-transport emitting layer around the interface with the electron injection layer 160 works as the emitting layer 150. The hole-transport emitting layer has an advantage of increasing efficiency in recombining holes and electrons, since holes injected from the anode 130 into the hole-transport emitting layer are trapped by the electron injection layer 160.

Furthermore, it is possible to have a layer for a particular purpose in between the anode 130 and the hole transport layer 140, between the hole transport layer 140 and the emitting layer 150, between the emitting layer 150 and the electron injection layer 160, and the like. For example, it is possible to have a hole injection layer in between the anode 130 and the hole transport layer 140, and an electron transport layer in between the emitting layer 150 and the electron injection layer 160. In addition, a hole block layer, an electron block layer, and the like may also be provided to the organic EL element 100.

Display

A display equipped with an active matrix device having the thin-film transistor 1 will now be described. Here, an electrophoretic display device is given as an example.

Figure 9:
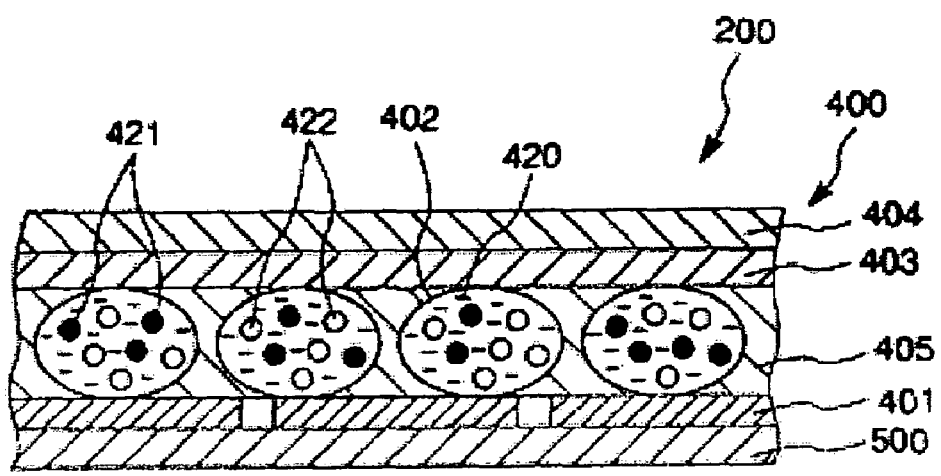
FIG. 9 is a schematic showing an electrophoretic display device to which a display of an exemplary aspect of the present invention is applied.
Figure 10:
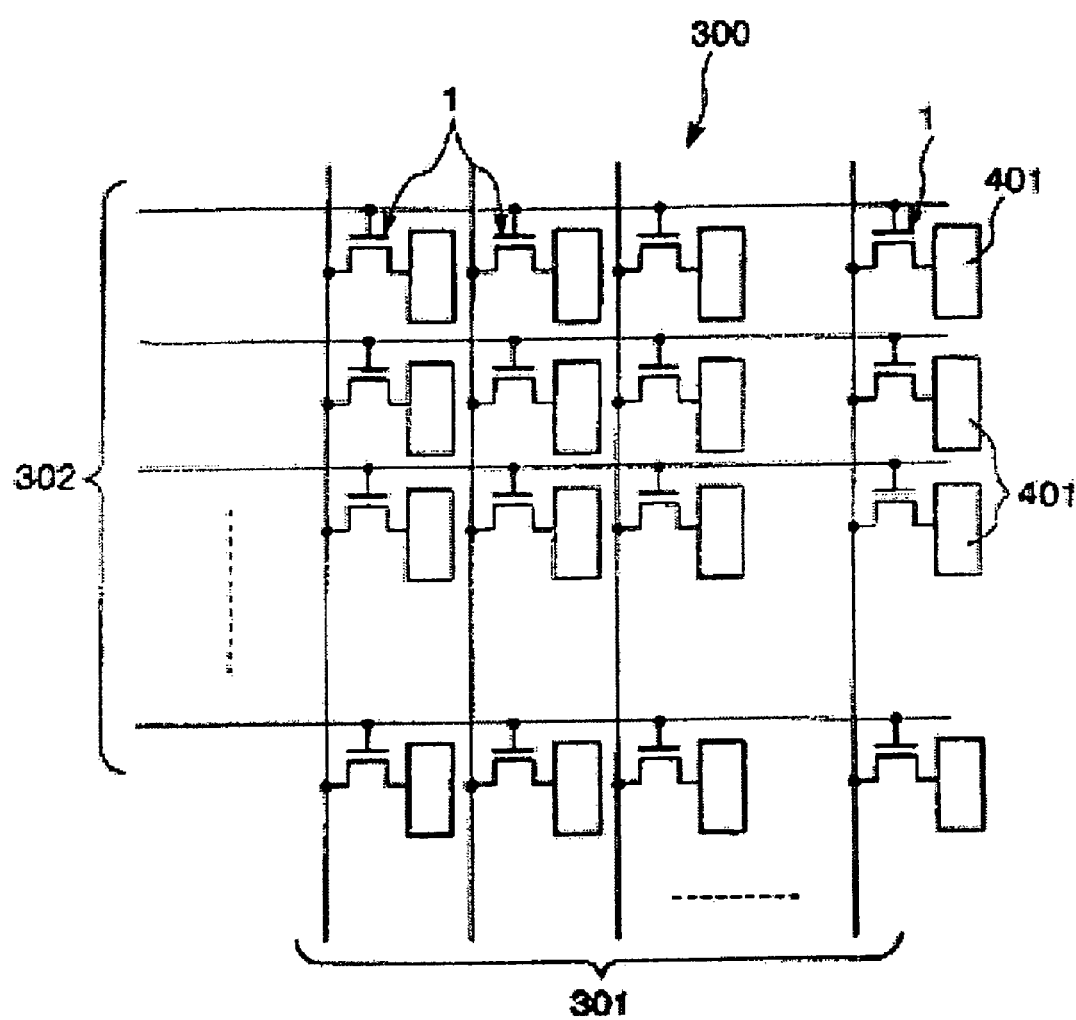
FIG. 10 is a schematic showing the structure of an active matrix device included in the electrophoretic display device shown in FIG. 9.

FIG. 9 is a schematic showing an electrophoretic display device to which the present invention is applied. FIG. 10 is a schematic showing an active matrix device included in the electrophoretic display device shown in FIG. 9.

Referring to FIG. 9, an electrophoretic display device 200 includes an active matrix device (electronic circuit of an exemplary aspect of the present invention) 300 provided on a substrate 500 and an electrophoretic display part 400 electrically coupled to the active matrix device 300. As shown in FIG. 10, the active matrix device 300 includes a plurality of data lines 301 and a plurality of scan lines 302 that intersect each other. The active matrix device 300 also includes a thin-film transistor 1 that is provided at each intersection of the data lines 301 and the scan lines 302. The gate electrode 50 included in the thin-film transistor 1 is coupled to the scan lines 302, the source electrode 20a to the data lines 301, and the drain electrode 20b to a pixel electrode (individual electrode) 401 that will be described later.

As shown in FIG. 9, the electrophoretic display part 400 includes a pixel electrode 401, a microcapsule 402, a transparent electrode (common electrode) 403, and a transparent substrate 404 that are stacked on the substrate 500 in this order. The microcapsule 402 is fixed between the pixel electrode 401 and the transparent electrode 403 by a binder material 405.

The pixel electrode 401 is divided so as to be arrayed in a matrix, that is, orderly in rows and columns. In each capsule 402, there are multiple kinds of electrophoretic particles which have different properties from each other. In the present exemplary embodiment, an electrophoretic dispersion liquid 420 including two kinds of electrophoretic particles 421 and 422 whose charges and hues are different from each other.

In the electrophoretic display device 200, if a selection signal (selection voltage) is supplied to one or more scan lines 302, a thin-film transistor 1 that is coupled to the scan lines 302 supplied with the selection signal (selection voltage) turns on. Thus, electrical connection between data lines 301 and a pixel electrode 401 that are coupled to the thin-film transistor 1 are substantially established. Here, if certain data (voltage) are supplied to the data lines 301, the data (voltage) are supplied to the pixel electrode 401. This produces an electric field between the pixel electrode 401 and the transparent electrode 403. The electrophoretic particles 421 and 422 move electrophoretically in a direction toward either electrode depending on the direction and strength of the electric field and properties of the electrophoretic particles 421 and 422.

If the supply of a selection signal (selection voltage) to the scan lines 302 is stopped, the thin-film transistor 1 turns off, cutting off the electrical connection between the data lines 301 and the pixel electrode 401 coupled to the thin-film transistor 1. Accordingly, by supplying or stopping a selection signal to the scan lines 302 and by supplying or stopping data to the data lines 301 in appropriate combination, a desirable image (information) is displayed on a display side (the transparent substrate 404 side) of the electrophoretic display device 200. In particular, since the electrophoretic display device 200 of the present exemplary embodiment has the electrophoretic particles 421 and 422 or different colors, it is possible to display multiple grayscale images.

Also, since the since the electrophoretic display device 200 of the present exemplary embodiment has the active matrix device 300, it selectively turns on and off the thin-film transistor 1 coupled to the scan lines 302. This can reduce or prevent crosstalk, increase the speed of circuit operation, and thereby enhance the quality of images (information). Moreover, the electrophoretic display device 200 of the present exemplary embodiment operates at a low driving voltage and saves electric power. It should be understood that the display of an exemplary aspect of the present invention is applicable not only to the electrophoretic display device 200, but also to any organic EL displays using the organic EL element 100 instead of the electrophoretic display part 400, and inorganic EL displays using inorganic EL elements, and liquid crystal displays using liquid crystal display elements.

Electronic Equipment

The electrophoretic display device 200 (display of an exemplary aspect of the present invention) can be built in various types of electronic equipment. Such electronic equipment of an exemplary aspect of the present invention including the electrophoretic display device 200 will now be described.

Electronic Paper

First, electronic paper to which electronic equipment of an exemplary aspect of the present invention is applied is described.

Figure 11:
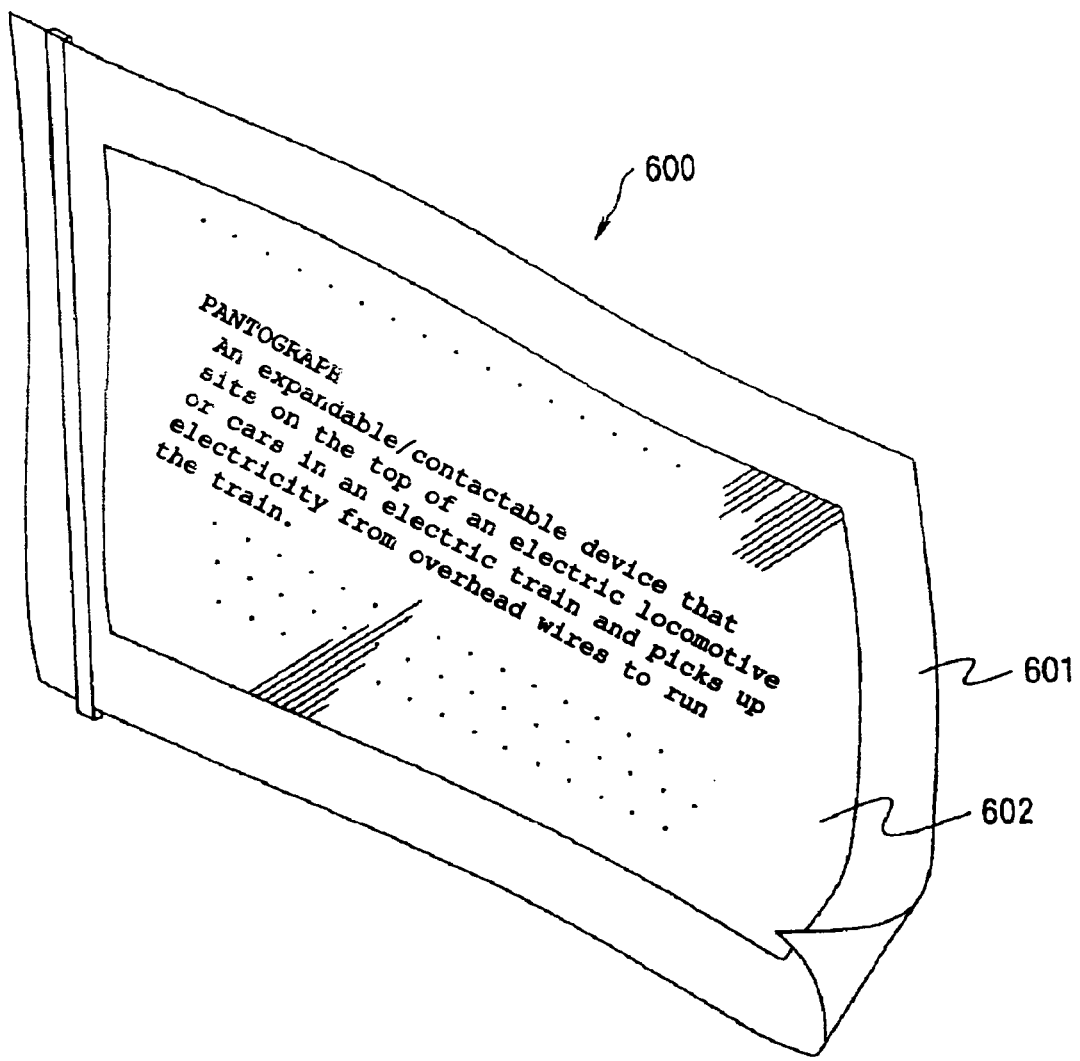
FIG. 11 is a schematic showing electronic paper to which electronic equipment of an exemplary aspect of the present invention is applied.

FIG. 11 is a schematic showing the electronic paper to which electronic equipment of an exemplary aspect of the present invention is applied. In this drawing, electronic paper 600 includes a body 601 and a display unit 602. The body 601 is made of a rewritable sheet having a texture and flexibility like paper. In the electronic paper 600, the display unit 602 includes the electrophoretic display device 200.

Display

Next, a display to which electronic equipment of an exemplary aspect of the present invention is applied is described.

Figure 12:
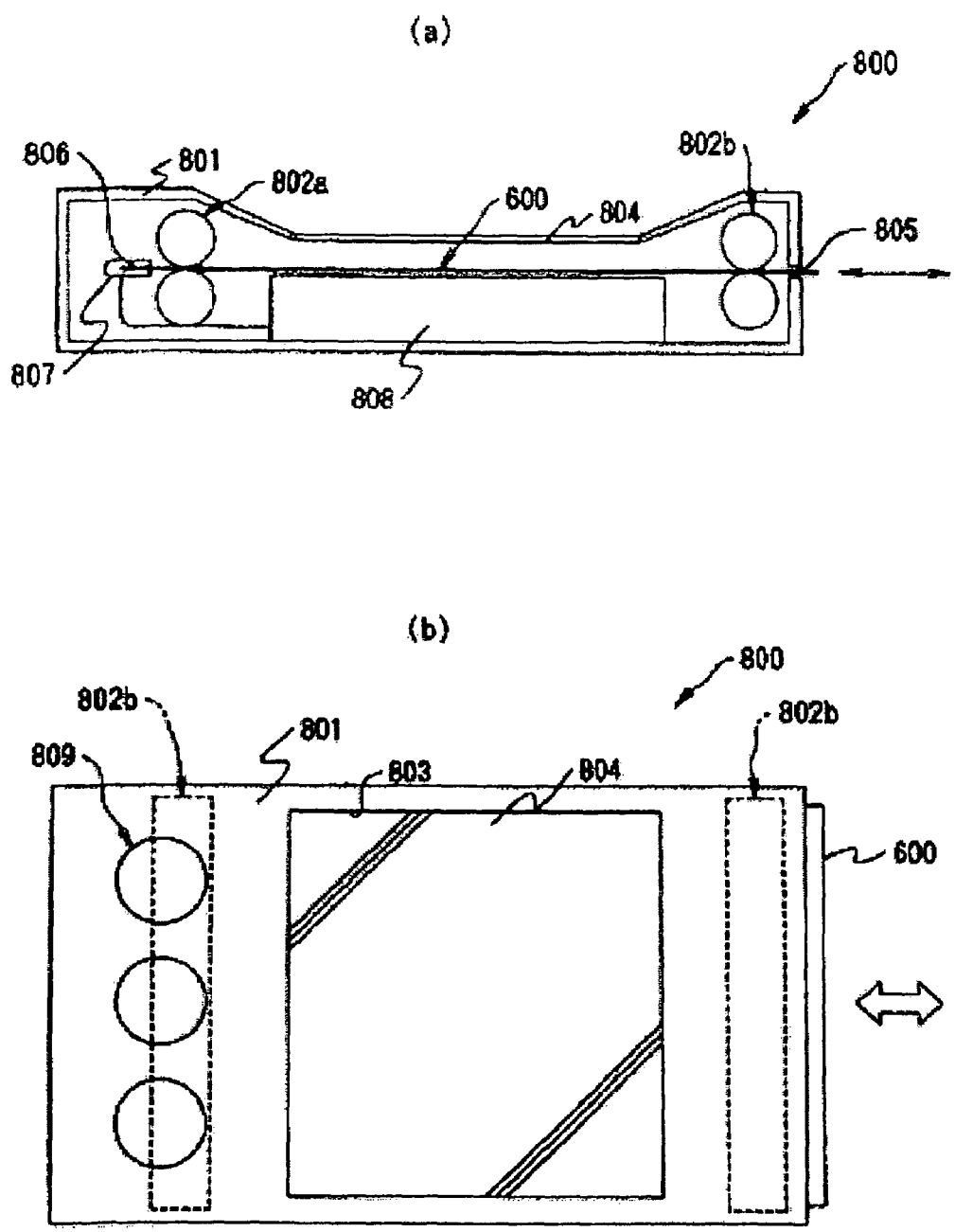
FIGS. 12(a) and 12(b) show a display to which electronic equipment of an exemplary aspect of the present invention is applied.

FIGS. 12(a) and 12(b) show the display to which electronic equipment of an exemplary aspect of the present invention is applied. FIG. 12(a) is a sectional view, and FIG. 12(b) is a plan view. Referring to FIG. 12, a display 800 includes a body 801 and electronic paper 600 that is detachably provided to the body 801. The electronic paper 600 has the above-mentioned structure, that is, the one shown in FIG. 11.

The body 801 has an insertion slot 805 on its side (right in the drawing) into which the electronic paper 600 is inserted. The body 801 also has a pair of feed rollers 802a and 802b inside. When the electronic paper 600 is inserted through the insertion slot 805 into the body 801, the electronic paper 600 is fed into the body 801, being sandwiched by the pair of feed rollers 802a and 802b.

The body 801 also has a rectangular opening 803 on the display side of the body 801 (front side in FIG. 12(b)). A transparent glass plate 804 is fitted in the opening 803. Accordingly, the electronic paper 600 fed into the body 801 is visible from the outside of the body 801. In other words, the display 800 makes a display by making the electronic paper 600 fed into the body 801 visible through the transparent glass plate 804.

Also, a terminal 806 is provided at an end in the direction toward which the electronic paper 600 is injected (left in the drawing). Inside the body 801, the terminal 806 is coupled to a socket 807 with the electronic paper 600 being fed into the body 801. The socket 807 is electrically coupled to a controller 808 and a control part 809. In this display 800, the electronic paper 600 is detachably fed into the body 801, and can be used out of the body 801 for portable use. In the display 800, the electronic paper 600 includes the electrophoretic display device 200.

Examples of electronic equipment according to an exemplary aspect of the present invention are not limited to the above-mentioned, and include TV sets, finder-view sets, direct-view video recorders, car navigation systems, pagers, electronic notebooks, calculators, electronic newspapers, word processors, personal computers, workstations, videophones, point-of-sale devices, touch-sensitive panel devices, and so on. The display of an exemplary aspect of the present invention, for example, the electrophoretic display device 200, is applicable to the display of various types of electronic equipment.

While the electrode, method to form an electrode, thin-film transistor, electronic circuit, organic EL element, display, and electronic equipment according to exemplary aspects of the present invention have been described, it should be understood that the present invention is not limited to these. For example, the electrode of an exemplary aspect of the present invention is applicable to electrodes for an anode and RF tag included in a solar cell (photoelectric switching element). Also, the method to form an electrode of an exemplary embodiment of the present invention may further include one or more steps for particular purposes. Furthermore, each element of the thin-film transistor, electronic circuit, organic EL element, display, and electronic equipment of an exemplary aspect of the present invention can be substituted by a given element that has a function of similar to the above-mentioned, and a given structure may be added to the above-mentioned.

EXAMPLES

Specific examples of exemplary aspects of the present invention will now be described.

A1. Manufacturing a Thin-Film Transistor

EXAMPLE A1

First, a glass substrate (OA10, made of NEC, Corning) was prepared and cleaned with ethanol so as to degrease its surface.

After being dried, the glass substrate was immersed in concentrated sulfuric acid so as to have a rough surface. This way, a plating film to be formed in the following step can have increased adhesiveness. Then, the glass substrate was washed with pure water. Next, a cycle of immersing the glass substrate in a sensitivity increasing liquid for 15 seconds and the washing the substrate with pure water was repeated four times. As the sensitivity increasing liquid, a solution (tin chloride (II) solution) of 37 wt % concentrated hydrochloric acid (1 mL/L) and $SnCl_2$ (1 g/L) was used.

Subsequently, the glass substrate was immersed in a Ni plating bath for five minutes. The conditions of the Ni plating bath are as follows:

Sodium hypophosphite solution: 0.15 mol/L
Ammonium sulfate solution: 0.50 mol/L
Sodium acid citrate solution: 0.20 mol/L
Nickel sulfate solution: 0.10 mol/L The four types of solutions in the same quantity were mixed and adjusted to have a pH 9.0 with a sodium hydroxide solution. By using a Ni plating bath at 90 degrees centigrade, a Ni plating film was formed on the glass substrate to an average thickness of 100 nm. Then, the glass substrate was washed with pure water, and dried at 50 degrees centigrade.

Next, a resist material (TSMR8900, made by Tokyo Ohka Kogyo) was supplied on the Ni plating film. The material was exposed to light and developed by photolithography so as to form a resist layer with a pattern corresponding to the shape of source and drain electrodes. Then, the glass substrate was immersed in a 5 to 10 wt % iron chloride solution at 30 through 40 degrees centigrade for 5 through 10 minutes. This way part of the Ni plating film not covered by the resist layer was removed, which completes the pattern corresponding to the shape of source and drain electrodes.

After removing the resist layer with a resist removing liquid, the glass substrate was washed with water and ethanol. Then, oxygen plasma treatment was performed on the Ni plating film. The conditions of the oxygen plasma treatment are as follows:

Plasma treatment device: PX1000 made by Samco International

Power: 200 W

Treatment period: For five minutes

Oxygen flow volume: 100 sccm

Argon flow volume: 100 sccm

This way the source electrode and the drain electrode of the structure shown in FIG. 4 were completed.

Subsequently, a 1% wt/vol toluene solution of F8T2 (poly (9,9-dioctylfluorene-co-bithiophene)) was applied on the glass substrate by spin coating at 2400 rpm, and the substrate was dried at 60 degrees centigrade for 10 minutes. This way an organic semiconductor layer was formed to an average thickness of 50 nm. Subsequently, a 5% wt/vol butyle acetate solution of polymethyl methacrylate (PMMA) was applied on the organic semiconductor layer by spin coating at 2400 rpm, and the layer was dried at 60 degrees centigrade for 10 minutes. This way a gate insulating layer was formed to an average thickness of 100 nm.

Next, a water dispersion of PEDOT (polyethylene-dioxythiophene) was applied on a portion on the gate insulating layer corresponding (viscosity: 5 cps at ambient temperatures) to a region between the source electrode and the drain electrode by ink jetting at a rate of 20 pL per drip, and the layer was dried at 80 degrees centigrade for 10 minutes. This way a gate electrode was formed to an average thickness of 100 nm. The thin-film transistor was thus manufactured through the above-mentioned steps.

EXAMPLE A2

A glass substrate was immersed in a 0.1 wt % nickel chloride solution to which dimethylborane as a reducer had been added at 40 degrees centigrade for five minutes, so as to form a Ni plating film. With the other steps being similar to the example A1, a thin-film transistor was completed. The average thickness of the Ni plating film was 100 nm.

EXAMPLE A3

In forming the source electrode and the drain electrode, a Cu plating film was formed instead of the Ni plating film. With the other steps being similar to the example A1, a thin-film transistor was completed. In this example, a glass substrate was immersed in a Cu plating bath for five minutes under the following conditions:

Formalin: 0.25 mol/liter

Ethylenediamine tetra acetic acid sodium salt solution: 0.06 mol/liter

Copper sulfate solution: 0.05 mol/liter 2,2'-dipyridyl solution: 20 mg/liter

Potassium hexacyanoferraete (II) solution: 50 mg/liter

The five types of solutions of the same quantity were mixed and adjusted to have pH 12.5 with a sodium hydroxide solution. A Cu plating bath at 90 degrees centigrade was used. The average thickness of a formed Cu plating film was 100 nm.

EXAMPLE A4

A glass substrate was immersed in a 0.5 wt % copper sulfate solution to which Rochelle salt as a complexing agent had been added at 20 degrees centigrade for ten minutes, so as to form a Cu plating film. With the other steps being similar to the example A1, a thin-film transistor was completed. The average thickness of a formed Cu plating film was 100 nm.

EXAMPLE A5

A Cu film was formed by liftoff instead forming the Ni plating film in this example. With the other steps being similar to the example A1, a thin-film transistor was completed. Specifically, a resist pattern was provided so as to cover a glass substrate other than portions corresponding source and drain electrodes. Thus the Cu film was deposited on the whole surface to a thickness of 100 nm. Then, the Cu film having the shape corresponding to the source and drain electrodes was completed by removing the resist pattern with a jet-scriber device.

EXAMPLE A6

In this example, oxygen plasma treatment was performed for 20 minutes. With the other steps being similar to the example A3, a thin-film transistor was completed. The average thickness of a formed Cu plating film was 100 nm.

EXAMPLE A7

A glass substrate was immersed in a 0.1 wt % cobalt chloride solution at 90 degrees centigrade for five minutes, so as to form a Co plating film. With the other steps being similar to the example A1, a thin-film transistor was completed. The average thickness of the Co plating film was 100 nm.

EXAMPLE A8

First, a glass substrate (OA10, made of NEC, Corning) was prepared and cleaned with ethanol so as to degrease its surface. After being dried, the glass substrate was immersed in concentrated sulfuric acid so as to have a rough surface. This way, a film to be formed in the following step can have increased adhesiveness. Then, the glass substrate was washed with pure water.

Next, a covering film containing NiO was formed to an average thickness of 100 nm on the glass substrate by reactive DC magnetron sputtering. The conditions of the magnetron sputtering are as follows:

Target: Metal Ni

Ultimate vacuum in the chamber: $5 \times 10^{-4}$ Pa

DC Power: 60 W

Introduced gas: Mixed gas of oxygen and argon (Oxygen: Argon=80: 20 (molar ratio))

Pressure in the chamber applied when forming the film: 0.65 Pa (5 mTorr)

Next, a resist material (TSMR8900, made by Tokyo Ohka Kogyo) was supplied on the covering film. The material was exposed to light and developed by photolithography so as to form a resist layer with a pattern corresponding to the shape of source and drain electrodes. Then, part of the covering film, not covered by the resist layer, was removed by reactive ion etching, which completes the pattern corresponding to the shape of source and drain electrodes. This way the source electrode and the drain electrode of the structure shown in FIG. 4 were completed. With the other steps being similar to the example A1, a thin-film transistor was completed.

EXAMPLE A9

In this example, the oxygen-argon ratio was changed to 25:75. With the other steps being similar to the example A8, a thin-film transistor was completed.

EXAMPLE A10

In this example, the oxygen-argon ratio was changed to 10:90. With the other steps being similar to the example A8, a thin-film transistor was completed.

EXAMPLES A11, A12, A13

In this example, metal Cu was used as a target instead of metal Ni. With the other steps being similar to the examples A8, A9, and A1, a thin-film transistor was completed.

EXAMPLES A14, A15, A16

In this example, metal Co was used as a target instead of metal Ni. With the other steps being similar to the examples A8, A9, and A10, a thin-film transistor was completed.

EXAMPLE A17

First, a glass substrate (OA10, made of NEC, Corning) was prepared and cleaned with ethanol so as to degrease its surface. After being dried, the glass substrate was immersed in concentrated sulfuric acid so as to have a rough surface. This way, a film to be formed in the following step can have increased adhesiveness. Then, the glass substrate was washed with pure water.

Next, a covering film containing $SrCu_2O_2$ was formed to an average thickness of 100 nm on the glass substrate by laser ablation. The conditions of the laser ablation are as follows:

Target: $SrCu_2O_2$ sintered body

Ultimate vacuum in the chamber: $5 \times 10^{-7}$ Pa

Laser: ArF excimer laser (Wavelength: 193 nm, Pulse length: 20 ns)

Energy density: 5 J/cm$^2$

Introduced gas: Oxygen gas

Pressure in the chamber applied when forming the film: 5 Pa

Temperature of the glass substrate: 250 degrees centigrade

Next, a resist material (TSMR8900, made by Tokyo Ohka Kogyo) was supplied on the covering film. The material was exposed to light and developed by photolithography so as to form a resist layer with a pattern corresponding to the shape of source and drain electrodes. Then, part of the covering film, not covered by the resist layer, was removed by reactive ion etching, which completes the pattern corresponding to the shape of source and drain electrodes. This way the source electrode and the drain electrode of the structure shown in FIG. 4 were completed. With the other steps being similar to the example A1, a thin-film transistor was completed.

EXAMPLE A18

In this example, a CuAlO$_2$ sintered body was used as a target instead of a SrCu$_2$O$_2$ sintered body. With the other steps being similar to the examples A17, a thin-film transistor was completed.

EXAMPLE A19

In this example, a CuGaO$_2$ sintered body was used as a target instead of a SrCu$_2$O$_2$ sintered body. With the other steps being similar to the examples A17, a thin-film transistor was completed.

EXAMPLE A20

First, a glass substrate (OA10, made of NEC, Corning) was prepared and cleaned with ethanol so as to degrease its surface. After being dried, the glass substrate was immersed in concentrated sulfuric acid so as to have a rough surface. This way, a film to be formed in the following step can have increased adhesiveness. Then, the glass substrate was washed with pure water.

Next, in the same way as the example A3, an underlying electrode layer (work function: 4.7 eV) containing Cu was formed to an average thickness of 80 nm. Then, in the same way as the example A11, a surface electrode layer (work function: 5.4 eV) containing Cu(II)O was formed to an average thickness of 20 nm. This way the source electrode and the drain electrode of the structure shown in FIG. 1 were completed. With the other steps being similar to the example A1, a thin-film transistor was completed.

EXAMPLE A21

First, a glass substrate (OA10, made of NEC, Corning) was prepared and cleaned with ethanol so as to degrease its surface. After being dried, the glass substrate was immersed in concentrated sulfuric acid so as to have a rough surface. This way, a film to be formed in the following step can have increased adhesiveness. Then, the glass substrate was washed with pure water.

Next, in the same way as the example A3, an underlying electrode layer (work function: 4.7 eV) containing Cu was formed to an average thickness of 80 nm. Then, in the same way as the example A17, a surface electrode layer (work function: 5.4 eV) containing SrCu$_2$O$_2$ was formed to an average thickness of 20 nm. This way the source electrode and the drain electrode of the structure shown in FIG. 1 were completed. With the other steps being similar to the example A1, a thin-film transistor was completed.

EXAMPLES A22, A23, A24

In this example, metal Co was used as a target instead of metal Ag. With the other steps being similar to the examples A8, A9, and A10, a thin-film transistor was completed.

EXAMPLE A25

A Cu vapor-deposited film instead the Cu plating film was formed to an average thickness of 100 nm by vacuum deposition in this example. With the other steps being similar to the example A1, a thin-film transistor was completed.

EXAMPLE A26

In this example, sulfurization was performed instead of oxygen plasma treatment. With the other steps being similar to the example A3, a thin-film transistor was completed. The sulfurization was carried out by heat-treating a Cu vapor-deposited film at 100 degrees centigrade for 30 minutes in the presence of hydrogen sulfide.

EXAMPLE A27

An Ag vapor-deposited film, instead the Cu plating film, was formed to an average thickness of 100 nm by vacuum deposition in this example. With the other steps being similar to the example A1, a shape corresponding to source and drain electrodes was patterned. Then, the Ag vapor-deposited film was chlorinated. This way the source electrode and the drain electrode of the structure shown in FIG. 4 were completed. The chlorination was carried out by heat-treating the Ag vapor-deposited film at 100 degrees centigrade for 30 minutes in the presence of hydrogen chloride. With the other steps being similar to the example A1, a thin-film transistor was completed.

EXAMPLE A28

With all the steps, except for chlorination, being similar to the example A27, a thin-film transistor was completed. First, an Ag vapor-deposited film was pretreated with HNO$_3$ of 3 M and washed with water. Next, a glass substrate was immersed in a HCl solution of 0.1 M. The Ag vapor-deposited film was electrified at a current density of 0.8 mA/cm$^2$ for 15 minutes so as to apply electrolysis. This way the source electrode and the drain electrode of the structure shown in FIG. 1 were completed.

COMPARATIVE EXAMPLE A1

In this comparative example, the oxygen-argon ratio was changed to 0: 100. With other steps being similar to the example A8, a thin-film transistor was completed.

COMPARATIVE EXAMPLE A2

In this comparative example, the oxygen-argon ratio was changed to 0: 100. With other steps being similar to the example A11, a thin-film transistor was completed.

COMPARATIVE EXAMPLE A3

In this comparative example, the oxygen-argon ratio was changed to 0: 100. With other steps being similar to the example A14, a thin-film transistor was completed.

COMPARATIVE EXAMPLE A4

In this comparative example, the oxygen-argon ratio was changed to 0: 100. With other steps being similar to the example A22, a thin-film transistor was completed.

A2 Evaluation

A2-1 Oxide Content Measurement

An area having an oxide, sulfide, and chloride, (hereinafter collectively called "metal compound") in the source electrode and the drain electrode of each example and comparative example, was identified, and the content of the metal compound was measured. X-ray microanalyzer (EPMA) was used for the measurement.

A2-2 Work Function Measurement

The work function of the source electrode and the drain electrode of each example and comparative example was measured. A simplified UPS device (AC-1, made by Riken Keiki) was used for the measurement.

A2-3 Evaluation on Transistor Properties

The carrier mobility μ, threshold voltage Vth, and S value of the thin-film transistor of each example and comparative example were measured. A 4156C precision semiconductor parameter analyzer made by Agilent Technologies was used for the measurement.

Here, the threshold voltage Vth is a gate voltage when an approximation formula representing the relationship between a gate voltage and $Id^{1/2}$ (Id: drain current value) becomes zero. In other words, it is a gate voltage required to start to pass a drain current. The S value was a gate voltage required to add a drain current value to the next digit. Therefore, a thin-film transistor has excellent properties when it has a large carrier mobility μ, a small absolute vale of the threshold voltage Vth, and a small S value. The results of the measurement are listed in Tables 1-1 and 1-2.

As shown in Tables 1-1 and 1-2, the thin-film transistor of each example was found to have excellent properties with a small absolute value of the threshold voltage Vth and S value, and a large carrier mobility μ. They were also found to show a tendency to increase their transistor properties as the content of an oxide (metal compound) increased in the source and drain electrodes. The thin-film transistor of each comparative example was found to have a large absolute value of the threshold voltage Vth and S value, and a small carrier mobility μ.

A2-4 Evaluation on Deterioration With Time

The carrier mobility μ, threshold voltage Vth, and S value of the thin-film transistor of the example A6 and the comparative example A2 were measured again after being left in an environment with a temperature of 25 degrees centigrade, a

TABLE 1-1

| Example | Source/Drain electrode | | | Work function (eV) | Carrier mobility μ (cm²/Vs) | Threshold voltage Vth (V) | S value (V) |
| | Average thickness (nm)[1] | Metal compound | Compound content (wt %) | | | | |
|---|---|---|---|---|---|---|---|
| A1 | 5 | NiO | 81 | 5.0 | $3.0 \times 10^{-3}$ | 0 | 1.0 |
| A2 | 6 | NiO | 75 | 5.0 | $3.0 \times 10^{-3}$ | 0 | 1.0 |
| A3 | 6 | Cu(II)O | 79 | 5.4 | $4.4 \times 10^{-3}$ | −1 | 1.6 |
| A4 | 5 | Cu(II)O | 76 | 5.4 | $4.4 \times 10^{-3}$ | 0 | 1.5 |
| A5 | 7 | Cu(II)O | 80 | 5.4 | $4.4 \times 10^{-3}$ | 0 | 1.5 |
| A6 | 10 | Cu(II)O | 95 | 5.4 | $4.6 \times 10^{-3}$ | 0 | 1.4 |
| A7 | 5 | CoO | 85 | 5.0 | $2.8 \times 10^{-3}$ | −1 | 1.7 |
| A8 | 100 | NiO | 100 | 5.0 | $3.0 \times 10^{-3}$ | 0 | 1.0 |
| A9 | 100 | NiO | 75 | 5.0 | $3.0 \times 10^{-3}$ | 0 | 1.0 |
| A10 | 100 | NiO | 50 | 5.0 | $3.0 \times 10^{-3}$ | −1 | 1.2 |
| A11 | 100 | Cu(II)O | 100 | 5.4 | $4.4 \times 10^{-3}$ | 0 | 1.5 |
| A12 | 100 | Cu(II)O | 75 | 5.4 | $4.4 \times 10^{-3}$ | 0 | 1.5 |
| A13 | 100 | Cu(II)O | 50 | 5.3 | $4.4 \times 10^{-3}$ | −1 | 1.6 |
| A14 | 100 | CoO | 100 | 5.0 | $2.8 \times 10^{-3}$ | −1 | 1.7 |
| A15 | 100 | CoO | 75 | 5.0 | $2.8 \times 10^{-3}$ | −1 | 1.8 |
| A16 | 100 | CoO | 50 | 5.0 | $2.8 \times 10^{-3}$ | −3 | 1.8 |

[1]The average thickness of a portion of the metal compound on the surface of the source or drain electrode

TABLE 1-2

| Example | Source/Drain electrode | | | Work function (eV) | Carrier mobility μ (cm²/Vs) | Threshold voltage Vth (V) | S value (V) |
| | Average thickness (nm)[1] | Metal compound | Compound content (wt %) | | | | |
|---|---|---|---|---|---|---|---|
| A17 | 100 | $SrCu_2O_2$ | 100 | 5.4 | $2.7 \times 10^{-3}$ | 0 | 1.5 |
| A18 | 100 | $CuAlO_2$ | 100 | 5.4 | $2.5 \times 10^{-3}$ | 0 | 1.5 |
| A19 | 100 | $CuGaO_2$ | 100 | 5.4 | $2.4 \times 10^{-3}$ | 0 | 1.5 |
| A20 | 20 | Cu(II)O | 100 | 5.4 | $4.4 \times 10^{-3}$ | 0 | 1.5 |
| A21 | 20 | $SrCu_2O_2$ | 100 | 5.4 | $2.7 \times 10^{-3}$ | 0 | 1.5 |
| A22 | 100 | $Ag(I)_2O$ | 100 | 5.3 | $3.0 \times 10^{-3}$ | −1 | 1.7 |
| A23 | 100 | $Ag(I)_2O$ | 75 | 5.3 | $3.0 \times 10^{-3}$ | −1 | 1.7 |
| A24 | 100 | $Ag(I)_2O$ | 50 | 5.3 | $3.0 \times 10^{-3}$ | −1 | 1.7 |
| A25 | 7 | $Cu(I)_2O$ | 80 | 5.4 | $4.4 \times 10^{-3}$ | 0 | 1.5 |
| A26 | 8 | $Cu(I)_2S$ | 86 | 5.0 | $3.0 \times 10^{-3}$ | 0 | 1.5 |
| A27 | 7 | $Ag(I)_2Cl$ | 90 | 5.2 | $2.7 \times 10^{-3}$ | −3 | 1.7 |
| A28 | 5 | $Ag(I)_2Cl$ | 95 | 5.2 | $2.7 \times 10^{-3}$ | −3 | 1.7 |
| CE[2] A1 | No compound included, whole Ni | | | 5.0 | $3.0 \times 10^{-3}$ | −7 | 2.0 |
| CE[2] A2 | No compound included, whole Cu | | | 4.7 | $0.5 \times 10^{-3}$ | −8 | 3.2 |
| CE[2] A3 | No compound included, whole Co | | | 5.0 | $2.8 \times 10^{-3}$ | −7 | 2.4 |
| CE[2] A4 | No compound included, whole Ag | | | 4.2 | $2.8 \times 10^{-3}$ | −10 | 3.0 |

[1]The average thickness of a portion of the metal compound on the surface of the source or drain electrode
[2]Comparative example water concentration of 10 ppm, and an oxygen concentration of 10 ppm for three days and for 57 days. The results of the measurement are listed in Table 2.

TABLE 2

|  | Days elapsed | Carrier mobility μ (cm$^2$/Vs) | Threshold voltage Vth (V) | S value (V) |
|---|---|---|---|---|
| Example A6 | 0 | 4.6 × 10$^{-3}$ | 0 | 1.4 |
|  | 3 | 4.6 × 10$^{-3}$ | 0 | 1.4 |
|  | 57 | 4.5 × 10$^{-3}$ | 0 | 1.4 |
| Comparative example A2 | 0 | 0.5 × 10$^{-3}$ | −6 | 2.6 |
|  | 3 | 0.5 × 10$^{-3}$ | −6 | 2.7 |
|  | 57 | 0.2 × 10$^{-3}$ | −8 | 3.5 |

As shown in Table 2, the thin-film transistor of the example A6 showed that it kept its original transistor properties after 57 days. However, the thin-film transistor of the comparative example A2 showed significant deterioration in its original transistor properties. This result shows that it is possible to reduce the likelihood or prevent the organic layer from being altered and deteriorated by containing an oxide (metal compound) around the surface of the source electrode and the drain electrode. This shows that it is possible to enhance the properties of the thin-film transistor and reduce the likelihood or prevent them from being altered and deteriorated as time passes by containing an oxide containing a certain element around the surface of the source electrode and the drain electrode.

B1 Manufacturing an Organic EL Element

EXAMPLE B1

First, a glass substrate (OA10, made of NEC, Corning) was prepared and cleaned with ethanol so as to degrease its surface. After being dried, the glass substrate was immersed in concentrated sulfuric acid so as to have a rough surface. This way, a plating film to be formed in the following step can have increased adhesiveness. Then, the glass substrate was washed with pure water.

Next, a cycle of immersing the glass substrate in a sensitivity increasing liquid for 15 seconds and the washing of the substrate with pure water was repeated four times. As the sensitivity increasing liquid, a solution (tin chloride (H) solution) of 37 wt % concentrated hydrochloric acid (1 mL/L) and $SnCl_2$ (1 g/L). Then, an anode was provided on the glass substrate to an average thickness of 100 nm in the same manner as the example A1. Subsequently, a 1% wt/vol water dispersion (BITRON P, made by Starck Witek) of PEDOT/PSS (poly(3,4-ethylenedioxythiophene/styrenesulfonate)) was applied on the anode by spin coating at 2400 rpm, and the substrate was dried at 60 degrees centigrade for 10 minutes. This way a hole transport layer was formed to an average thickness of 50 nm.

Subsequently, a 1% wt/vol toluene solution of F8T2 (poly (9,9-dioctylfluorene-co-bithiophene)) was applied on hole transport by spin coating at 2400 rpm, and the substrate was dried at 60 degrees centigrade for 10 minutes. This way an emitting layer was formed to an average thickness of 60 nm. Next, a film of calcium was formed on the emitting layer by vacuum deposition. This way an electron injection layer was formed to an average thickness of 20 nm.

Next, a film of indium zinc oxide (IZO) was formed on the electron injection layer by sputtering. This way a cathode was formed to an average thickness of 100 nm. Then, a sealing member made of a glass material was joined to the glass substrate so as to seal the anode, the hole transport layer, the emitting layer, the electron injection layer, and the cathode.

The organic EL element shown in FIG. 8 was thus manufactured through the above-mentioned steps.

EXAMPLE B2

In this example, the anode was formed in the same manner as the example A3. With the other steps similar to the example B1, an organic EL element was completed.

EXAMPLE B3

In this example, the anode was formed in the same manner as the example A7. With the other steps similar to the example B1, an organic EL element was completed.

EXAMPLE B4

In this example, the anode was formed in the same manner as the example A8. With the other steps similar to the example B1, an organic EL element was completed.

EXAMPLE B5

In this example, the anode was formed in the same manner as the example A11. With the other steps similar to the example B1, an organic EL element was completed.

EXAMPLE B6

In this example, the anode was formed in the same manner as the example A14. With the other steps similar to the example B1, an organic EL element was completed.

EXAMPLE B7

In this example, the anode was formed in the same manner as the example A17. With the other steps similar to the example B1, an organic EL element was completed.

EXAMPLE B8

In this example, the anode was formed in the same manner as the example A18. With the other steps similar to the example B1, an organic EL element was completed.

EXAMPLE B9

In this example, the anode was formed in the same manner as the example A19. With the other steps similar to the example B1, an organic EL element was completed.

EXAMPLE B10

In this example, the anode was formed in the same manner as the example A25. With the other steps similar to the example B1, an organic EL element was completed.

EXAMPLE B11

In this example, the anode was formed in the same manner as the example A26. With the other steps similar to the example B1, an organic EL element was completed.

EXAMPLE B12

In this example, the anode was formed in the same manner as the example A28. With the other steps similar to the example B1, an organic EL element was completed.

COMPARATIVE EXAMPLE B1

In this example, the anode was formed in the same manner as the comparative example A1. With the other steps similar to the example B1, an organic EL element was completed.

COMPARATIVE EXAMPLE B2

In this example, the anode was formed in the same manner as the comparative example A2. With the other steps similar to the example B1, an organic EL element was completed.

COMPARATIVE EXAMPLE B3

In this example, the anode was formed in the same manner as the comparative example A3. With the other steps similar to the example B11, an organic EL element was completed.

REFERENCE EXAMPLE

In this example, the anode was formed by forming a film of indium tin oxide (ITO) by sputtering. With the other steps similar to the example B1, an organic EL element was completed.

B2 Evaluation

B2-1 Oxide Content Measurement

The oxide content measurement was carried out in the same as in A2-1.

B2-2 Work Function Measurement

The work function measurement was carried out in the same as in A2-2.

B2-3 Luminescence Intensity Measurement

The luminescence intensity (luminance) of the organic EL element of each example, each comparative example, and the reference example was measured with a voltage of 6 V being applied in between the anode and the cathode. The results of the measurement are listed in Table 3. The luminescence intensity values in Table 3 are shown relatively with the luminescence intensity of the comparative example B2 being set as one.

TABLE 3

| | Anode | | | | |
|---|---|---|---|---|---|
| Example | Average thickness (nm)[1] | Metal compound | Compound content (wt %) | Work function (eV) | Luminescence intensity (relative value) |
| B1 | 5 | NiO | 85 | 5.0 | 27 |
| B2 | 5 | Cu(II)O | 80 | 5.4 | 32 |
| B3 | 5 | CoO | 83 | 5.0 | 24 |
| B4 | 100 | NiO | 100 | 5.0 | 25 |
| B5 | 100 | Cu(II)O | 100 | 5.4 | 30 |
| B6 | 100 | CoO | 100 | 5.0 | 22 |
| B7 | 100 | $SrCu_2O_2$ | 100 | 5.4 | 28 |
| B8 | 100 | $CuAlO_2$ | 100 | 5.4 | 26 |
| B9 | 100 | $CuGaO_2$ | 100 | 5.4 | 27 |
| B10 | 6 | $Cu(I)_2O$ | 76 | 5.4 | 30 |
| B11 | 8 | $Cu(I)_2S$ | 81 | 5.0 | 30 |
| B12 | 5 | $Ag(I)_2Cl$ | 90 | 5.2 | 29 |
| $CE^2$ B1 | No compound included, whole Ni | | | 5.0 | 0.9 |
| $CE^2$ B2 | No compound included, whole Cu | | | 4.7 | 1 |
| $CE^2$ B3 | No compound included, whole Co | | | 5.0 | 0.7 |
| $RE^3$ | 100 | ITO | 100 | 4.8 | 20 |

[1]The average thickness of a portion of the metal compound on the surface of the anode
[2]Comparative example
[3]Reference example As shown in Table 3, the luminescence intensity of the organic EL element of each example was equal to or higher than that of the reference example. Meanwhile, the luminescence intensity of the organic EL element of each comparative example was significantly lower than that of the reference example to the extent that they were unsuitable for practical use. The results were the same for an organic EL element having an anode made of Ag. Here, the anode was formed in the same manner as the comparative example A4. With the other steps similar to the example B 1, the organic EL element was completed. The luminescence intensity of the organic EL element was 0.1 through 0.5 times as large as that of the comparative example B2.

What is claimed is:

1. An active matrix device having a plurality of data lines and a plurality of scan lines that intersect each other, a plurality of thin-film transistors provided at each of a plurality of intersections of the plurality of data lines and the plurality of scan lines, each of the plurality of thin-film transistors comprising: a gate electrode; an organic semiconductor layer including a p-type organic semiconductor material; a gate insulating layer positioned between the gate electrode and the organic semiconductor layer; and first and second electrodes contacting the organic semiconductor layer, at least the first electrode including a metal layer and a metal-oxide layer, the metal-oxide layer including Cu being disposed between the organic semiconductor layer and the metal layer.

2. An active matrix device having a plurality of data lines and a plurality of scan lines that intersect each other, a plurality of thin-film transistors provided at each of a plurality of intersections of the plurality of data lines and the plurality of scan lines, each of the plurality of thin-film transistors comprising: a gate electrode; an organic semiconductor layer including a p-type organic semiconductor material; a gate insulating layer positioned between the gate electrode and the organic semiconductor layer; and first and second electrodes contacting the organic semiconductor layer, at least the first electrode including a metal layer and a metal-oxide layer, the metal-oxide layer including Ni being disposed between the organic semiconductor layer and the metal layer.

3. An active matrix device having a plurality of data lines and a plurality of scan lines that intersect each other, a plurality of thin-film transistors provided at each of a plurality of intersections of the plurality of data lines and the plurality of scan lines, each of the plurality of thin-film transistors comprising: a gate electrode; an organic semiconductor layer including a p-type organic semiconductor material; a gate insulating layer positioned between the gate electrode and the organic semiconductor layer; and first and second electrodes contacting the organic semiconductor layer, at least the first electrode including a metal layer and a metal-oxide layer, the metal-oxide layer including Co being disposed between the organic semiconductor layer and the metal layer.

4. An active matrix device having a plurality of data lines and a plurality of scan lines that intersect each other, a plurality of thin-film transistors provided at each of a plurality of intersections of the plurality of data lines and the plurality of scan lines, each of the plurality of thin-film transistors comprising: a gate electrode; an organic semiconductor layer including a p-type organic semiconductor material; a gate insulating layer positioned between the gate electrode and the organic semiconductor layer; and first and second electrodes contacting the organic semiconductor layer, at least the first electrode including a metal layer and a metal-oxide layer, the metal-oxide layer including Ag being disposed between the organic semiconductor layer and the metal layer.

5. An active matrix device having a plurality of data lines and a plurality of scan lines that intersect each other, a plurality of thin-film transistors provided at each of a plurality of intersections of the plurality of data lines and the plurality of scan lines, each of the plurality of thin-film transistors comprising: a gate electrode; an organic semiconductor layer including a p-type organic semiconductor material; a gate insulating layer positioned between the gate electrode and the organic semiconductor layer; and first and second electrodes contacting the organic semiconductor layer, at least the first electrode including a metal layer and a metal-oxide layer, the metal-oxide layer including Al being disposed between the organic semiconductor layer and the metal layer.

6. An active matrix device having a plurality of data lines and a plurality of scan lines that intersect each other, a plurality of thin-film transistors provided at each of a plurality of intersections of the plurality of data lines and the plurality of scan lines, each of the plurality of thin-film transistors comprising: a gate electrode; an organic semiconductor layer including a p-type organic semiconductor material; a gate insulating layer positioned between the gate electrode and the organic semiconductor layer; and a first and second electrodes contacting the organic semiconductor layer, at least the first electrode including a metal layer and a metal sulfide layer, the metal sulfide layer being disposed between the organic semiconductor layer and the metal layer.

7. An active matrix device having a plurality of data lines and a plurality of scan lines that intersect each other, a plurality of thin-film transistors provided at each of a plurality of intersections of the plurality of data lines and the plurality of scan lines, each of the plurality of thin-film transistors comprising: a gate electrode; an organic semiconductor layer including a p-type organic semiconductor material; a gate insulating layer positioned between the gate electrode and the organic semiconductor layer; and a first and second electrodes contacting the organic semiconductor layer, at least the first electrode including a metal layer and a metal chloride layer, the metal chloride layer being disposed between the organic semiconductor layer and the metal layer.

* * * * *